(12) United States Patent
Cakmak et al.

(10) Patent No.: US 11,552,240 B2
(45) Date of Patent: Jan. 10, 2023

(54) MACHINES AND PROCESSES FOR PRODUCING POLYMER FILMS AND FILMS PRODUCED THEREBY

(71) Applicant: Purdue Research Foundation, West Lafayette, IN (US)

(72) Inventors: Mukerrem Cakmak, West Lafayette, IN (US); Armen Yildirim, West Lafayette, IN (US); Rahim Rahimi, West Lafayette, IN (US); Saeed Mohammadi, Zionsville, IN (US); Ali Shakouri, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 721 days.

(21) Appl. No.: 16/571,794

(22) Filed: Sep. 16, 2019

(65) Prior Publication Data

US 2020/0013946 A1 Jan. 9, 2020

Related U.S. Application Data

(63) Continuation-in-part of application No. 16/167,714, filed on Oct. 23, 2018, now Pat. No. 11,203,675.

(Continued)

(51) Int. Cl.
*H01L 41/193* (2006.01)
*G01L 1/18* (2006.01)
(Continued)

(52) U.S. Cl.
CPC ............... *H01L 41/193* (2013.01); *G01L 1/18* (2013.01); *G01L 9/06* (2013.01); *H01L 41/0472* (2013.01);
(Continued)

(58) Field of Classification Search
CPC ............... H01L 41/193; H01L 41/0472; H01L 41/0805; H01L 41/0825; H01L 41/09;
(Continued)

(56) References Cited

U.S. PATENT DOCUMENTS 4,624,796 A   11/1986   Giniewicz et al.
4,944,891 A   7/1990    Sagong et al.
(Continued)

FOREIGN PATENT DOCUMENTS

CN   104861656 A  *  8/2015   ............... H01B 1/22
FR   2989829 A1   *  10/2013  ............... G01J 1/02
(Continued)

OTHER PUBLICATIONS

Sakamoto et al., Characterization and application of PZT/PU and graphite doped PZT/PU composite, Sensors Actuators, A Phys. 100, 165-174, 2002.
(Continued)

*Primary Examiner* — Jarrett J Stark
(74) *Attorney, Agent, or Firm* — Piroozi-IP, LLC

(57) ABSTRACT

A sensor is disclosed which includes a piezoelectric layer, a piezoresistive layer, one or more electrode layers coupled to the piezoelectric layer and to the piezoresistive layer, the piezoelectric layer configured to provide an electrical signal in response to application of a dynamic disturbance, and the piezoresistive layer configured to provide a change in resistivity in response to application of a static disturbance.

10 Claims, 28 Drawing Sheets
(26 of 28 Drawing Sheet(s) Filed in Color)

Related U.S. Application Data

(60) Provisional application No. 62/576,601, filed on Oct. 24, 2017.

(51) Int. Cl.
| | |
|---|---|
| *G01L 9/06* | (2006.01) |
| *H01L 41/047* | (2006.01) |
| *H01L 41/187* | (2006.01) |
| *H01L 41/08* | (2006.01) |
| *H01L 41/09* | (2006.01) |
| *H01L 41/113* | (2006.01) |

(52) U.S. Cl.
CPC ...... *H01L 41/0805* (2013.01); *H01L 41/0825* (2013.01); *H01L 41/09* (2013.01); *H01L 41/1132* (2013.01); *H01L 41/1876* (2013.01)

(58) Field of Classification Search
CPC ............. H01L 41/1132; H01L 41/1876; H01L 41/183; H01L 41/37; H01L 41/113; G01L 1/18; G01L 9/06; G01L 1/16
See application file for complete search history.

(56) References Cited

U.S. PATENT DOCUMENTS

| | | | |
|---|---|---|---|
| 5,760,530 | A | 6/1998 | Kolesar |
| 5,801,475 | A | 9/1998 | Kimura |
| 7,467,558 | B2 | 12/2008 | Fukuda et al. |
| 7,702,439 | B2 | 4/2010 | Kithil |
| 7,781,943 | B1 | 8/2010 | Hamel et al. |
| 10,025,118 | B1 | 7/2018 | Markus et al. |
| 11,203,675 | B2 * | 12/2021 | Cakmak ............... C09D 183/04 |
| 2005/0134149 | A1 | 6/2005 | Deng et al. |
| 2008/0174273 | A1 | 7/2008 | Priya et al. |
| 2014/0359757 | A1 | 12/2014 | Sezan et al. |
| 2015/0134061 | A1 | 5/2015 | Friis et al. |
| 2015/0200351 | A1 | 7/2015 | Zawada et al. |
| 2018/0195921 | A1 * | 7/2018 | Al Ahmad ............ G01L 9/0042 |
| 2021/0217810 | A1 * | 7/2021 | Guo ....................... H01L 27/20 |

FOREIGN PATENT DOCUMENTS

| | | | | | |
|---|---|---|---|---|---|
| GB | | 2527775 A | * | 1/2016 | ......... G02F 1/13338 |
| WO | WO-2014053886 A1 | | * | 4/2014 | ............ G06F 3/041 |

OTHER PUBLICATIONS

Liu et al., Characterization of PZT/PVC composites added with carbon black, J. Wuhan Univ. Technol. Mater. Sci. Ed. 20, 60-64, 2005.
Yang et al., Converting biomechanical energy into electricity by a muscle-movement-driven nanogenerator, Nano Lett. 9, 1201-1205, 2009.
Sundar et al., Dielectric and piezoelectric properties of percolative three-phase piezoelectric polymer composites, J. Vac. Sci. Technol. B, Nanotechnol. Microelectron. Mater. Process. Meas. Phenom. 34, 041232, 2016.
Sundaram et al., Dielectric and Piezoelectric Properties of Various Ferroelectric Ceramic-Polymer Composites, J. Environ. Nanotechnol. 3, 27-31, 2014.
Hu et al., A nanogenerator for energy harvesting from a rotating tire and its application as a self-powered pressure/speed sensor. Adv. Mater. 23, 4068-4071, 2011.
Papadakis et al., Dielectrophoretic assembly of reversible and irreversible metal nanowire networks and vertically aligned arrays, Appl. Phys. Lett. 88, 2006.
Chang et al., Direct-write piezoelectric polymeric nanogenerator with high energy conversion efficiency, Nano Lett. 10, 726-731, 2010.
Mishra et al., Effect of particle size on the ferroelectric behavior of tetragonal and rhombohedral Pb(Zr x Ti 1-x)O3 ceramics and powders, J. Phys. Condens. Matter 7, 9287-9303, 1995.
10) Maurya et al., Energy harvesting and strain sensing in smart tire for next generation autonomous vehicles, Appl. Energy 232, 312-322, 2018.
Lee et al., Flexible graphene-PZT ferroelectric nonvolatile memory, Nanotechnology, 2013.
Ren et al., Flexible Lead-Free BiFeO3/PDMS-Based Nanogenerator as Piezoelectric Energy Harvester, ACS Appl. Mater. Interfaces 8, 26190-26197, 2016.
Persano et al., High performance piezoelectric devices based on aligned arrays of nanofibers of poly (vinylidenefluoride-co-trifluoroethylene), Nat. Commun. 4, 2013.
Gao et al., Highly oriented BaTiO3 film self-assembled using an interfacial strategy and its application as a flexible piezoelectric generator for wind energy harvesting, J. Mater. Chem. A 3, 9965-9971, 2015.
Sharma et al., Patterning piezoelectric thin film PVDF-TrFE based pressure sensor for catheter application, Sensors Actuators, A Phys. 177, 87-92, 2012.
Cross et al., Perforated Pzt-Polymer Composites For Piezoelectric Transducer Applications, Ferroelectrics 41, 197-205, 1982.
Chorsi, et al., Piezoelectric Biomaterials for Sensors and Actuators, Advanced Materials 31, 2019.
Wang et al., Piezoelectric field effect transistor and nanoforce sensor based on a single ZnO nanowire, Nano Lett. 6, 2768-2772, 2006.
Mason, Piezoelectricity, its history and applications, J. Acoust. Soc. Am. 70, 1561-1566, 1981.
Wooten et al., Piezoelectric polymer-based collision detection sensor for robotic applications, Electron. 4, 204-220, 2015.
Ramadan et al., A review of piezoelectric polymers as functional materials for electromechanical transducers, Smart Materials and Structures 23, 2014.
Tanaka et al., Measurement and evaluation of tactile sensations using a PVDF sensor, J. Intell. Mater. Syst. Struct. 19, 35-42, 2008.
Van Den Ende et al., Improving the d33 and g33 properties of 0-3 piezoelectric composites by dielectrophoresis, J. Appl. Phys. 107, 2010.
Van Den Ende et al., Direct strain energy harvesting in automobile tires using piezoelectric PZT-polymer composites. Smart Mater. Struct. 21, 2012.
Yao et al., Structural health monitoring of multi-spot welded joints using a lead zirconate titanate based active sensing approach, Smart Mater. Struct. 25, 2015.
Zirkl et al., An all-printed ferroelectric active matrix sensor network based on only five functional materials forming a touchless control interface, Adv. Mater. 23, 2069-2074, 2011.
Guo et al., Roll-to-roll continuous manufacturing multifunctional nanocomposites by electric-field-assisted 'z' direction alignment of graphite flakes in poly (dimethylsiloxane), ACS Appl. Mater. Interfaces 9, 919-929, 2017.
Kang, Dielectrophoretic motions of multiple particles under an alternating-current electric field, Eur. J. Mech. B/Fluids 54, 53-68, 2015.
Kretschmer et al., Pearl chain formation of nanoparticles in microelectrode gaps by dielectrophoresis, Langmuir 20, 11797-11801, 2004.
Moncada-Hernandez et al., Theoretical and experimental examination of particle-particle interaction effects on induced dipole moments and dielectrophoretic responses of multiple particle chains, Electrophoresis 35, 1803-1813, 2014.
Xie et al., Frequency effects on interactive motion of dielectrophoretic particles in an AC electrical field, Eur. J. Mech. B/Fluids 53, 171-179, 2015.
Kędziora et at., M. Piezoelectric Transducers, Key Eng. Mater. 542, 75-80, 2013.
Guo et al., Origin of the high piezoelectric response in PbZr1-xTixO3, Phys. Rev. Lett. 84, 5423-5426, 2000.
Graz et al., Flexible Ferroelectret Field-Effect Transistor for Large-Area Sensor Skins and Microphones, Appl. Phys. Lett. 89, 73501, 2006.
Fan et al., Flexible Nanogenerators for Energy Harvesting and Self-Powered Electronics, Advanced Materials 28, 4283-4305, 2016.

(56) References Cited

OTHER PUBLICATIONS

Ounaies et al., Evidence of Piezoelectricity In SWNT-Polyimide And SWNT-PZT-Polyimide Composites, J. Thermoplast. Compos. Mater. 21, 393-409, 2008.
Xu et al., Self-Powered Nanowire Devices, Nat. Nanotechnol. 5, 366-373, 2010.
Dagdeviren et al., Conformable Amplified Lead Zirconate Titanate Sensors with Enhanced Piezoelectric Response for Cutaneous Pressure Monitoring., 2014.
Abolhasani et al., PVDF/graphene composite nanofibers with enhanced piezoelectric performance for development of robust nanogenerators, Compos. Sci. Technol. 138, 49-56, 2017.
Holmes-Siedle et al., PVdF: An electronically-active polymer for industry. Mater, Des. 4, 910-918, 1983.
Lee et al., Highly Sensitive and Multifunctional Tactile Sensor Using Free-standing ZnO/PVDF Thin Film with Graphene Electrodes for Pressure and Temperature Monitoring, Sci. Rep. 5, 2015.
Martins et al., Electroactive phases of poly(vinylidene fluoride): Determination, processing and applications, Prog. Polym. Sci. 39, 683-706, 2014.
Meng, Processing, Structure and Ferroelectric Properties of PVDF-Based Ferroelectric Polymers, PhD Diss., 2017.
Shirinov et al., Pressure sensor from a PVDF film, Sensors Actuators, A Phys. 142, 48-55, 2008.
Strashilov et al., Structural impact on piezoelectricity in PVDF and P(VDF-TrFE) thin films, Appl. Phys. A Mater. Sci. Process. 118, 1469-1477, 2014.
Ting et al., A new approach of polyvinylidene fluoride (PVDF) poling method for higher electric response, Ferroelectrics 446, 28-38, 2013.
Wegener et al., Ferroelectric polarization in stretched piezo- and pyroelectric poly(vinylidene fluoride-hexafluoropropylene) copolymer films, J. Appl. Phys. 92, 7442-7447, 2002.
Xu et al., Facile preparation of highly oriented poly(vinylidene fluoride) uniform films and their ferro- and piezoelectric properties, RSC Adv. 7, 17038-17043, 2017.
Ahn et al., Enhanced piezoelectric properties of electrospun poly(vinylidene fluoride)/multiwalled carbon nanotube composites due to high β-phase formation in poly(vinylidene fluoride), J. Phys. Chem. C 117, 11791-11799, 2013.
Broadhurst et al., Piezoelectricity and pyroelectricity in polyvinylidene fluoride—A model, J. Appl. Phys. 49, 4992-4997, 1978.
Chang et al., Large d33 and enhanced ferroelectric/dielectric properties of poly(vinylidene fluoride)-based composites filled with Pb(Zr0.52Ti0.48)O3 nanofibers, RSC Adv. 5, 51302-51307, 2015.
Graz et al., Flexible active-matrix cells with selectively poled bifunctional polymer-ceramic nanocomposite for pressure and temperature sensing skin, J. Appl. Phys. 106, 2009.
Fatuzzo et al., Ferroelectric Device, Ferroelectric Body and Method Of Fabrication Thereof, No. 183,942, 1962.
Hu et al., A Transparent Antipeep Piezoelectric Nanogenerator to Harvest Tapping Energy on Screen, Small 12, 1315-1321, 2016.
Khan et al., Piezoelectric thin films: An integrated review of transducers and energy harvesting, Smart Materials and Structures 25, 2016.
Kimoto et al., A proposal of new layer sensor based on PVDF film for material identification. Sensors Actuators, A Phys. 161, 23-28, 2010.
Ma et al., Investigation of the transient behavior of a cantilever beam using PVDF sensors, Sensors 12, 2088-2117, 2012.
Wu et al., Lead Zirconate Titanate Nanowire Textile Nanogenerator for Wearable Energy-Harvesting and Self-Powered Devices, ACS Nano 6, 6231-6235, 2012.

Venkatragavaraj et al., Piezoelectric Properties of Ferroelectric PZT-Polymer Composites, J. Phys. D. Appl. Phys. 34, 487-492, 2001.
Mishra et al., Advances in Piezoelectric Polymer Composites for Energy Harvesting Applications: A Systematic Review, Macromolecular Materials and Engineering 304, 2019.
Schwartz et al., Flexible Polymer Transistors with High Pressure Sensitivity for Application in Electronic Skin And Health Monitoring, Nat. Commun. 4, 1859, 2013.
Park et al., Flexible and Large-Area Nanocomposite Generators Based On Lead Zirconate Titanate Particles and Carbon Nanotubes, Adv. Energy Mater. 3, 1539-1544, 2013.
Wilson, Electric Field Structuring of Piezoelectric Composite Materials, PhD diss., 1999.
Kim et al., Piezoresistive Graphene/P(VDF-TrFE) Heterostructure Based Highly Sensitive and Flexible Pressure Sensor, ACS Appl. Mater. Interfaces 11, 16006-16017, 2019.
Barber et al., Polymer composite and nanocomposite dielectric materials for pulse power energy storage, Materials, Basel 2, 1697-1733, 2009.
Xu et al., Recent developments for flexible pressure sensors: A review, Micromachines 9, 580, 2018.
Dagdeviren et al., Recent progress in flexible and stretchable piezoelectric devices for mechanical energy harvesting, sensing and actuation, Extreme Mechanics Letters 9, 269-281, 2016.
Panneerselvam et al., A Review on PZT-Polymer Composites: Dielectric and Piezoelectric Properties, Nano Vision 93-239, 2013.
Li et al., Recent progress in flexible pressure sensor arrays: From design to applications, Journal of Materials Chemistry C 6, 11878-11892, 2018.
Hu et al., Recent progress in piezoelectric nanogenerators as a sustainable power source in self-powered systems and active sensors, Nano Energy 14, 3-14, 2014.
Park et al., Self-Powered Real-Time Arterial Pulse Monitoring Using Ultrathin Epidermal Piezoelectric Sensors, Adv. Mater. 29, 2017.
Park et al., Stretchable piezoelectric nanocomposite generator, Nano Converg. 3, 12, 2016.
Sun et al., Stretchable Piezoelectric Sensing Systems for Self-Powered and Wireless Health Monitoring, Adv. Mater. Technol. 4, 2019.
Jiao et al., The charge storage characteristics of PZT nanocrystal thin film, Ultramicroscopy 108, 1371-1373, 2008.
Katsouras et al., The negative piezoelectric effect of the ferroelectric polymer poly(vinylidene fluoride), Nat. Mater. 15, 78-84, 2016.
Ghoneim et al., Thin PZT-Based Ferroelectric Capacitors on Flexible Silicon for Nonvolatile Memory Applications, Adv. Electron. Mater. 1, 2015.
Hanna, Transport and Fatigue Properties of Ferroelectric Polymer P(VDF-TrFE) for Nonvolatile Memory Applications, PhD diss., 2012.
Zhao et al., Active health monitoring of an aircraft wing with embedded piezoelectric sensor/actuator network: I. Defect detection, localization and growth monitoring, Smart Mater. Struct. 16, 1208-1217, 2007.
Zhang et al., Piezoelectric materials for cryogenic and high-temperature applications, in Structural Health Monitoring, (SHM) in Aerospace Structures 59-93, Elsevier Inc., 2016.
Sekine et al., Fully Printed Wearable Vital Sensor for Human Pulse Rate Monitoring using Ferroelectric Polymer, Sci. Rep. 8, 2018.
Abbasipour et al., The piezoelectric response of electrospun PVDF nanofibers with graphene oxide, graphene, and halloysite nanofillers: a comparative study, J Mater. Sci. Mater. Electron. 28, 15942-15952, 2017.

\* cited by examiner

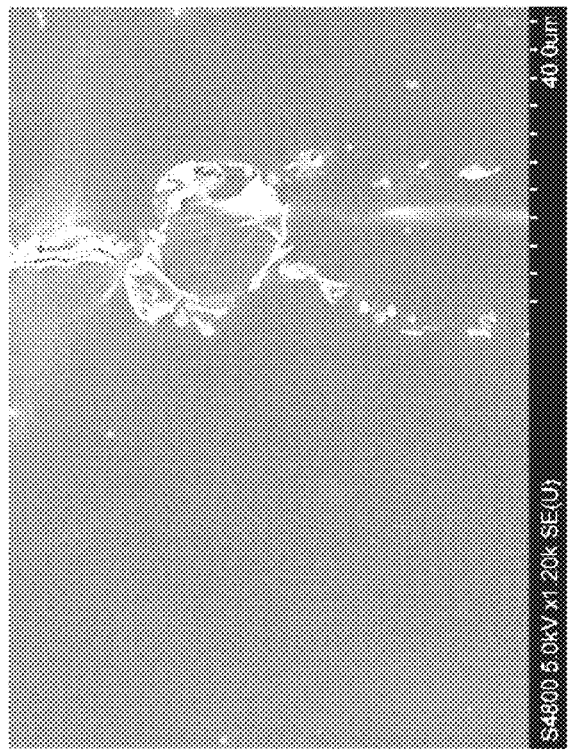
FIG. 16

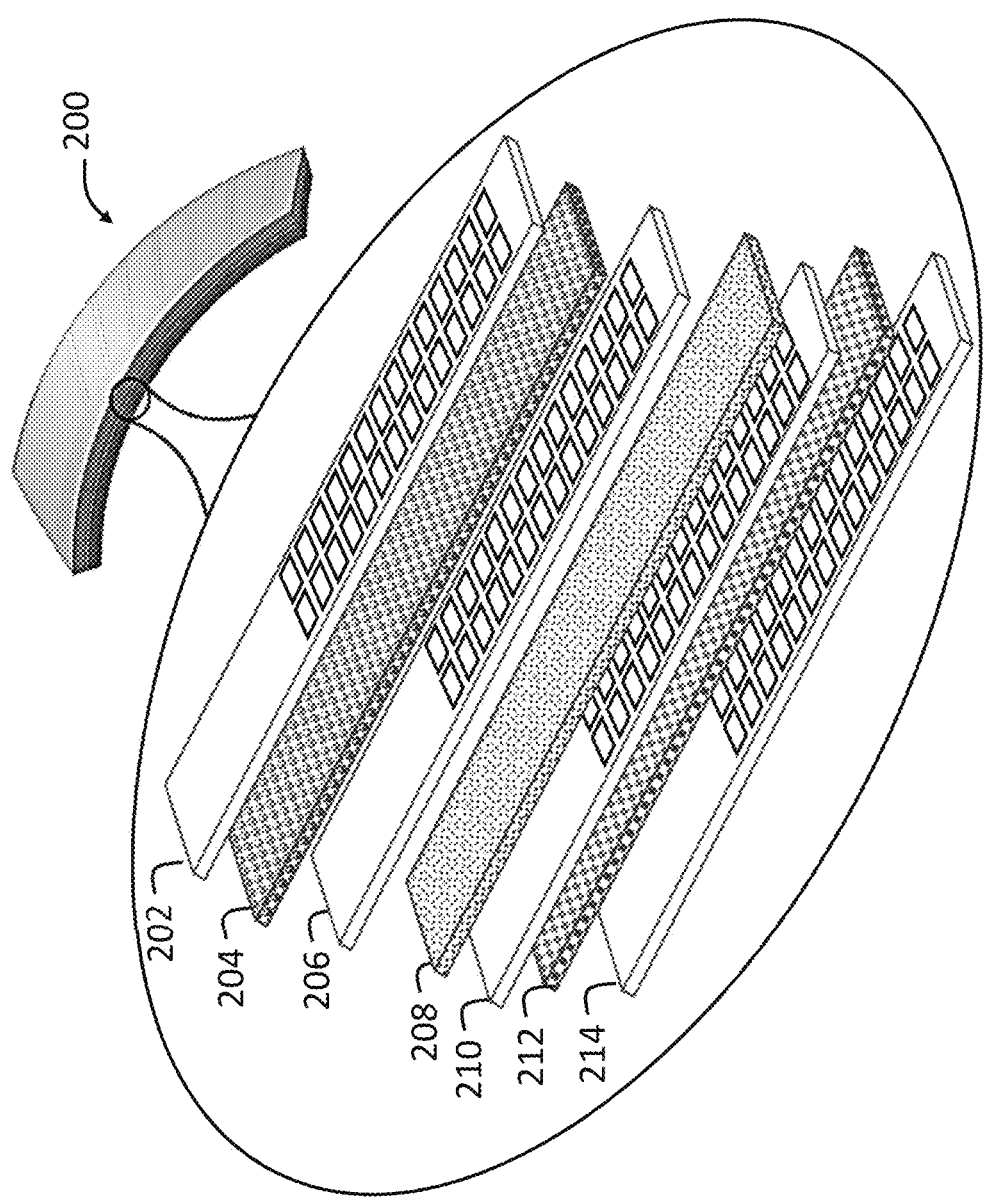

MACHINES AND PROCESSES FOR PRODUCING POLYMER FILMS AND FILMS PRODUCED THEREBY

CROSS REFERENCE TO RELATED APPLICATIONS

This patent application is a continuation-in-part application which is related to and claims the priority benefit of U.S. Non-Provisional patent application Ser. No. 16/167,714 filed Oct. 23, 2018 and which claims the benefit of U.S. Provisional Application No. 62/576,601, filed Oct. 24, 2017, the contents of each of which are incorporated herein by reference into the present disclosure.

BACKGROUND OF THE INVENTION

The present invention generally relates to machines and processes for producing polymer films. The invention particularly relates to machines and processes capable of producing piezoelectric polymer composite films suitable for the fabrication of flexible multifunctional devices, as non-limiting examples, highly sensitive sensors and nanogenerators.

The potential impacts of wearable technologies have become more evident with the introduction of the "Internet of Things" (IoT), which can basically be described as a smart network where every electronic device is connected to each other through embedded sensors and the Internet. As a result, there is an increasing demand for the use of flexible, ultra-lightweight and transparent sensors and nanogenerators for self-powered electronics adapted for use in a wide range of applications, as a nonlimiting example, personal health monitoring, soft robotics, human-inspired electronic skin (e-skin), energy harvesting, and biomedical applications. Among various types of available systems, piezoelectric materials and their polymer counterparts are attracting a great deal of attention due to their high levels of sensitivity and fast response times even at small deformations.

Among polymers, poly(vinylidene fluoride) (PVDF) and its copolymers, such as poly(vinylidene fluoride-co-trifluoroethylene) (PVDF-TrFE), are believed to exhibit the highest piezoelectric coefficient values. Ultra-high sensitive piezoelectric devices have been reported based on aligned nanofibers of PVDF-TrFE that can sense pressures as low as 0.1 Pa. Likewise, conformal piezoelectric devices have been reported based on lead zirconate titanate (PZT) that are capable of monitoring cutaneous pressure changes at very low pressure sensitivity levels (for example, about 0.005 Pa with 0.1 ms precision).

In addition to pressure sensors and other mechanical sensing devices, other notable applications for piezoelectric materials include kinetic energy harvesting for self-powered macroscale and nanoscale electronic devices. As an example, nanoscale mechanical energy has been converted into electrical energy by utilizing aligned zinc oxide (ZnO) nanowires as piezoelectric nanogenerators with an estimated power efficiency of 17 to 30%. Fully rollable nanogenerator systems have been introduced based on ZnO nanowires between chemical vapor deposition (CVD)-grown large scale graphene electrodes. Self-powered thin patch loudspeakers have been reported that are based on ferroelectret nanogenerators (FENGs). Such devices can be used in various areas ranging from sound recording thin films to microphones for privacy security applications. PZT and barium titanate ($BaTiO_3$) have also been utilized extensively for the development of nanogenerators and various other energy harvesting applications. Advanced piezoelectric devices have been reported based on PZT ribbons that harvest energy directly from the natural contraction and relaxation motions of the heart, lungs, and diaphragm. PZT nanotubes have been fabricated and utilized for power generation with diameter and length values of 200 nm and 58 μm, respectively. The PZT nanotube-based system was reportedly able to generate up to 469 mV when a steel nugget was dropped from different heights. PZT nanotube-based energy harvesters have been reported in which nanotubes were embedded into a polydimethylsiloxane (PDMS) matrix. The observed current and voltage outputs were reported to be around 54.5 nA and 1.52 V, respectively. The production of large area PZT and carbon nanotube-based nanocomposite generators have been demonstrated wherein 100 V voltage output and 10 μA current generation were reported during the application of irregular biomechanical deformations onto a 30 cm×30 cm sample. Chemical epitaxial growth of PZT nanowires and their application as a power source for wireless microelectronics have been reported as achieving an output voltage of 0.7 V with a power density of 2.8 mW $cm^3$.

Besides the aforementioned studies and innovations, the alignment of piezoelectric materials in a specific direction is capable of further improving the energy harvesting features of nanogenerators devices. A flexible nanogenerator with 209 V output voltage and a current density of 23.5 $\mu A/cm^2$ has been reported, wherein PZT fibers were aligned in a thickness (z) direction of a film. Furthermore, the dielectrophoretic properties of piezo compounds can also be utilized to achieve preferential alignment. As an example, the electric field induced alignment of PZT nanowires has been demonstrated wherein PZT nanowires were synthesized by an electrospinning technique and aligned in the z-direction under a uniform external electric field. It was observed that the alignment of the PZT particles drastically changed the piezoelectric properties of the composite material in terms of voltage and current output. The effect of the alignment of $BaTiO_3$ nanofibers in vertical and horizontal modes has also been reported. In one case, a maximum voltage of 2.67 V and a current of 261.40 nA was reported for $BaTiO_3$ nanofibers vertically aligned in a PDMS matrix.

Notwithstanding the above achievements, further improvements are desired for nanogenerators, pressure sensors, and their production, for example, in terms of their flexibility, power efficiency, transparency (in applications such as touchscreen interfaces, display panels, and electronic skin for soft robotics), and compatibility with continuous large-scale production processes that are more cost effective than batch processing methods.

BRIEF DESCRIPTION OF THE INVENTION

The present invention provides processes and machines suitable for producing polymer films, as a nonlimiting example, a piezoelectric polymer composite film, and the films produced thereby.

According to one aspect of the invention, a process for producing a piezoelectric polymer composite film includes combining lead zirconate titanate (PZT) particles and electrically conductive nanoparticles in a liquid polymer precursor matrix, aligning the PZT and nanoparticles along nanocolumns in a thickness direction of the liquid polymer precursor matrix by subjecting the PZT and nanoparticles to a uniform electric field, and solidifying the liquid polymer precursor matrix to form a piezoelectric polymer composite film comprising the PZT and nanoparticles in a polymer matrix formed by solidifying the liquid polymer precursor matrix. The PZT and nanoparticles are subjected to the uniform electric field for a duration sufficient to promote sensitivity and/or energy harvesting properties of the piezoelectric polymer composite film.

According to another aspect of the invention, a piezoelectric polymer composite film is provided that includes a polymer matrix with lead zirconate titanate (PZT) particles and electrically conductive nanoparticles aligned along nanocolumns in a thickness direction of the polymer matrix.

Other aspects of the invention include roll-to-roll machines configured to perform the process comprising the steps described above.

Technical aspects of the process described above preferably include the ability to produce high performance, flexible piezoelectric polymer composite films, including PZT/GNP-based devices, for example, for use as piezoelectric nanogenerators (piezonanogenerators, PENGs) and highly sensitive pressure sensors, in which PZT particles and GNPs (or other electrically conductive nanoparticles) are aligned within a polymer film under an electric field in the thickness (z) direction of the film. By appropriately aligning the PZT particles and GNPs, the amount of particles required to develop a piezoelectric polymer composite can be greatly reduced. As a result, if the film is formed of a transparent or translucent material, a high level of transparency can be maintained, as is desired for certain applications, as a nonlimiting example, touchscreen interfaces. Moreover, the electric field-induced alignment of the conductive nanoparticles (i.e., graphene nanoplatelets) along with the PZT nanoparticles facilitates the charge transport in the system. Preferential alignment in the thickness direction is also capable of giving rise to a unique structure where the pattern of PZT chains around the GNPs is similar to electric field lines around an electrically conducting particle when placed in a uniform external electric field. Because the nanoparticles align along nanocolumns in the thickness direction of the film, the transparency of the film becomes direction dependent, with normal direction viewing being the most transmissive and transmissivity decreasing in off-normal directions, leading to the ability to form films that may be useful for privacy screen applications, providing multifunctionality in a single contiguous product.

Furthermore, preferred embodiments of the process can be compatible with continuous large-scale roll-to-roll (R2R) production lines that are capable of increasing the size and number of devices that can be produced in a given time period while reducing material costs in comparison to traditional methods for producing piezoelectric polymer composites.

Other aspects and advantages of this invention will be further appreciated from the following detailed description.

A sensor is also disclosed which includes a piezoelectric layer, a piezoresistive layer, one or more electrode layers coupled to the piezoelectric layer and to the piezoresistive layer, the piezoelectric layer configured to provide an electrical signal in response to application of a dynamic disturbance, and the piezoresistive layer configured to provide a change in resistivity in response to application of a static disturbance

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 16 contain SEM images obtained from a large-area electric field aligned sample (R2R).

FIG. 28 is a schematic of a perspective view of a sensor/actuator, according to one embodiment of the present disclosure.

DETAILED DESCRIPTION OF THE INVENTION

The following describes machines and processes for producing polymer films, including piezoelectric polymer composite films (or simply, piezoelectric films) suitable for the fabrication of flexible multifunctional devices, as nonlimiting examples, nanogenerators and highly sensitive force and pressure sensors. The machines and processes are capable of providing for roll-to-roll (R2R) production of flexible transparent multifunctional devices in which lead zirconate titanate (PZT) particles and graphene nanoplatelets (GNPs) are aligned in a transparent polymer film, for example, polydimethylsiloxane (PDMS) or similar soft polymer matrix such as a polyurethane, silicone rubber, etc., to yield flexible and transparent PZT/GNP-based piezonanogenerators (PENGs) for self-powered electronics and sensor applications. The machines and processes are preferably implemented on continuous large-scale roll-to-roll production lines.

In investigations leading to the present invention, piezoelectric polymer composite films were produced by combining lead zirconate titanate (PZT) particles as piezoelectric fillers (0.50 vol %) and a small volume fraction (0.02 vol. %) of graphene nanoplatelets (GNPs) in a liquid polymer precursor matrix of polydimethylsiloxane (PDMS) commercially available from Dow Corning under the name Sylgard® 184. To promote the sensitivity and the energy harvesting properties of the piezoelectric composites, the PZT particles and GNPs were then aligned in the thickness (z) direction of the matrix by being subjected to a uniform electric field. Though graphene was used, other electrically conductive nanoparticles, including but not limited to other electrically conductive graphitic nanoparticles (e.g., single and multiwall carbon nanotubes, graphite etc.) could be used to increase the charge transport rate, and hence the sensitivity and the response time. Thermocurable PDMS was chosen for the matrix film material in view of its well-known properties in flexible electronics, such as high elasticity, optical transparency, and low cost. However, various other polymeric resins (e.g., thermo- and photocurable thermosets or thermoplastics) could be used, as nonlimiting examples, similar soft polymer materials such as a polyurethane or a silicone rubber. Though 0.50 vol % PZT concentration was selected for the investigation, it is believed that based on this and other investigations reported herein that suitable PZT concentrations in a given system may range from about 0.05 vol % to about 15 vol %, depending on the particular application. As examples, lower concentrations may be suitable for applications in which ultra-high sensitivity is not necessarily required, whereas higher concentrations may be suitable for high voltage output applications at the expense of transparency.

Figure 1:
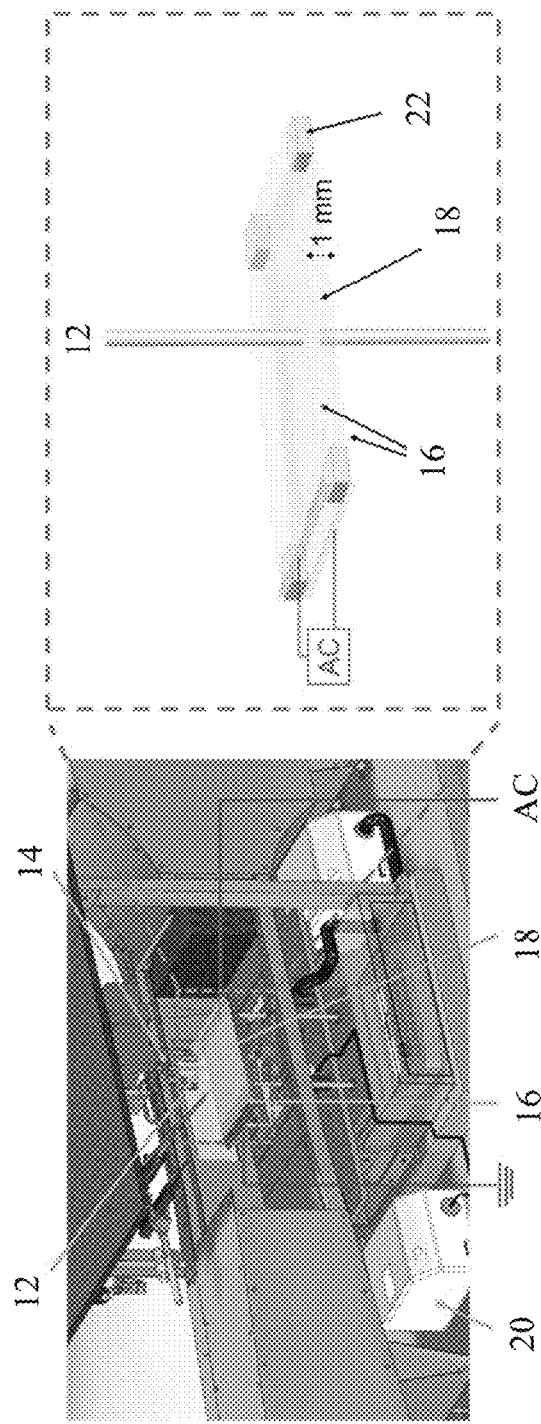
FIG. 1 schematically represents a real-time measurement system configured to track light transmission during electric field induced alignment. The inset represents the electric field alignment setup.

The PZT particles and GNPs were uniformly dispersed in the thermocurable PDMS resin using a planetary centrifugal mixer and then a curing agent for the PDMS was introduced into the mixture at a 1:10 ratio to the PDMS. A doctor-blade casting method was used to cast 150 μm-thick piezoelectric films between two indium tin oxide (ITO)-coated glass panels that served as bottom and top electrodes. The gap between the electrodes was kept constant at 1 mm by using glass spacers. The PZT particles within different films were then aligned at four different AC electric field strengths at a constant frequency (100 Hz): 250 V/mm, 500 V/mm, 750 V/mm, and 1000 V/mm. A real-time measurement system was developed and used to track the real-time light transmission during electric field alignment. The system, depicted in FIG. 1, included a zero-degree light transmission 12, light detector 14, transparent ITO coated glass 16, sample 18, light source 20, and glass spacers 22.

Figure 2:
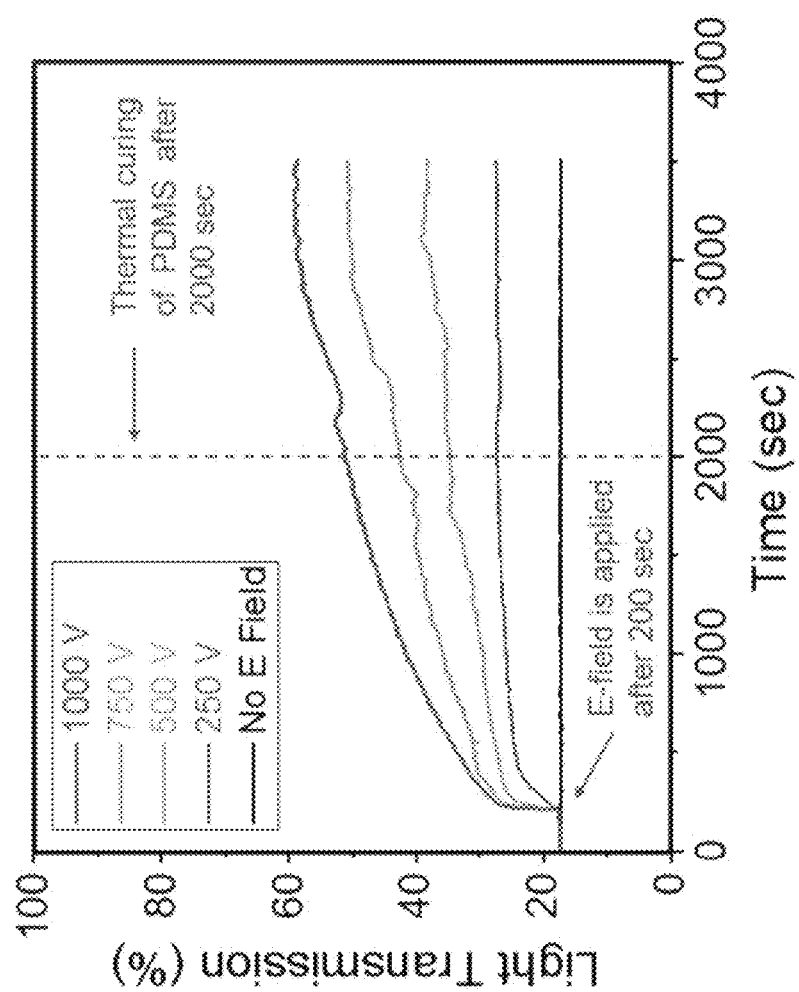
FIG. 2 is a graph that reveals the effect of applied field strength on light transmission through piezoelectric films produced to contain PZT particles in accordance with a nonlimiting embodiment of the invention.
Figure 3:
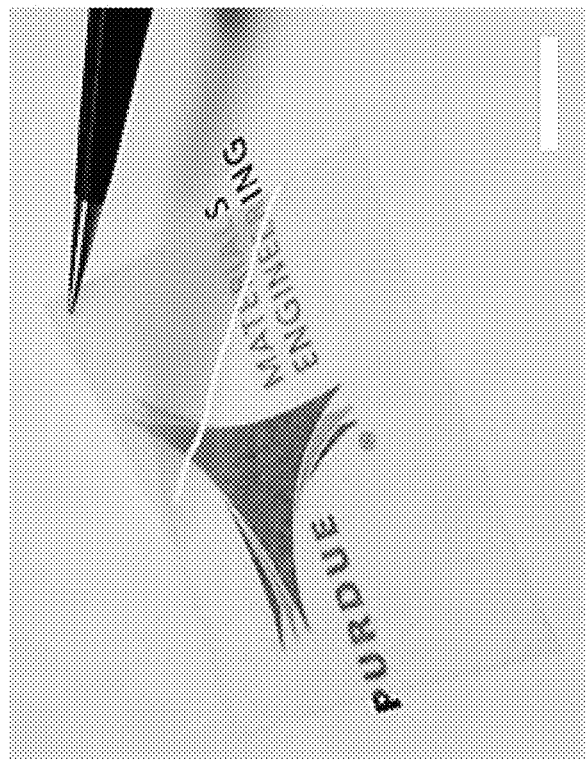
FIG. 3 contains an image showing an electric field aligned 150 µm-thick PZT/PDMS piezoelectric film.
Figure 4:
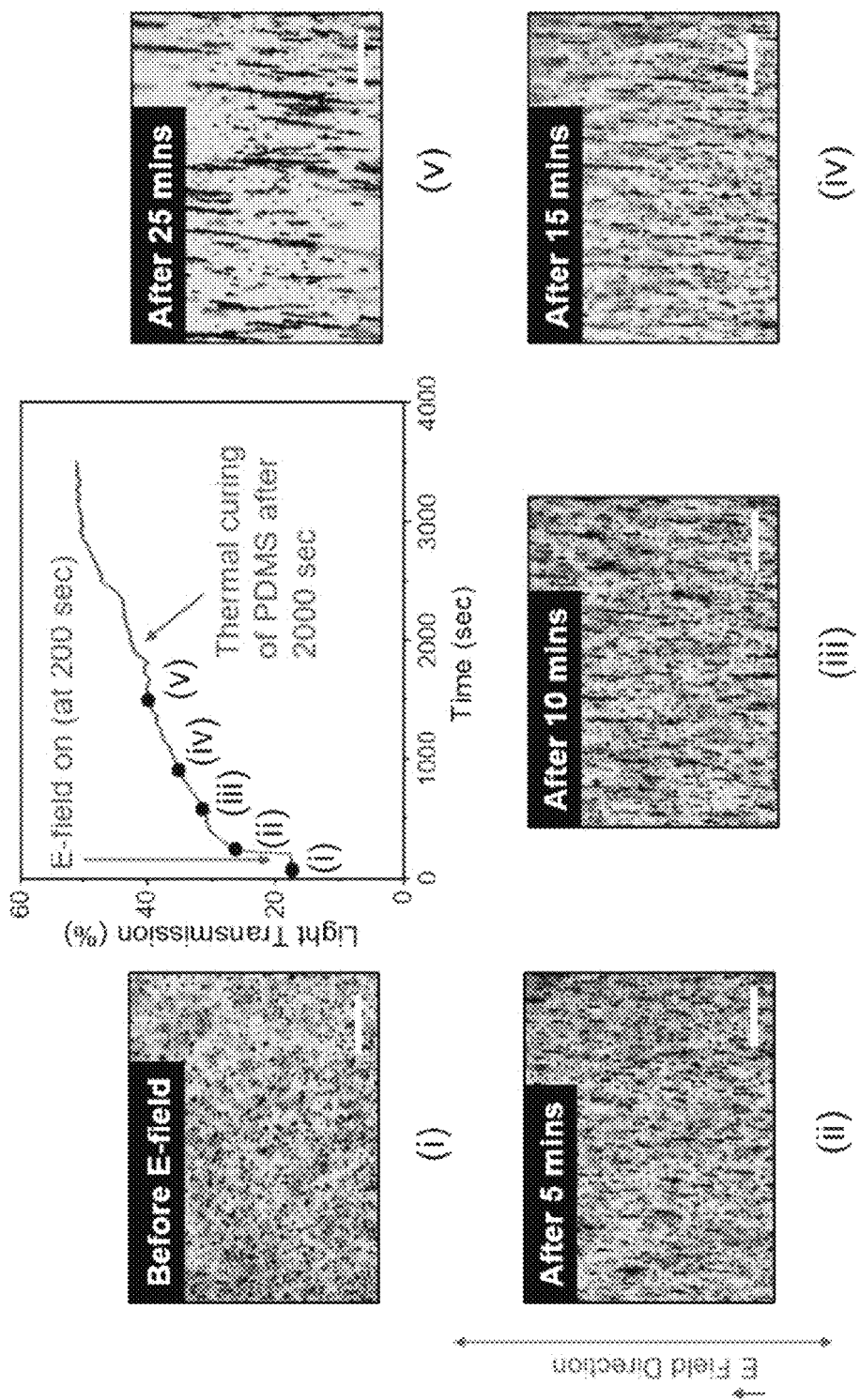
FIG. 4 evidences that within, the piezoelectric films, the PZT particles are progressively arranged in nano- and micro-columnar structures along the applied electric field direction.

FIG. 2 is a graph that reveals the effect of applied field strength on the light transmission through the piezoelectric films. When the electric field was applied after 200 seconds, a sharp increase in light transmission was observed due to the alignment of PZT particles in columns along the applied electric field. As shown in optical microscope images of FIG. 4, at this stage the PZT particles had assembled themselves into nano- and micro-columnar structures along the applied electric field direction, forming depletion zones in between which allowed light to travel through the films with less scattering and absorption losses. FIG. 3 shows the transparency level of a 150 μm thick PZT/PDMS sample aligned at 1000 V/mm (scale bar=1 cm). FIG. 4 shows the progressive alignment of PZT particles into nano- and micro-columnar structures resulting from an electric field ("E Field") strength of 750V/mm (scale bar=50 μm), in which image (i) was before application of the electric field and images (ii) through (v) were 5, 10, 15, and 25 minutes, respectively, after the application of the electric field. Light transmission sharply increased with increasing field strength and tended to saturate and level off over time. For a film subjected to a field strength of 1000 V/mm (FIG. 2), the light transmission started at about 18% and rose to about 60%, indicating the alignment of PZT particles in the direction of the applied electric field.

Figure 5B:
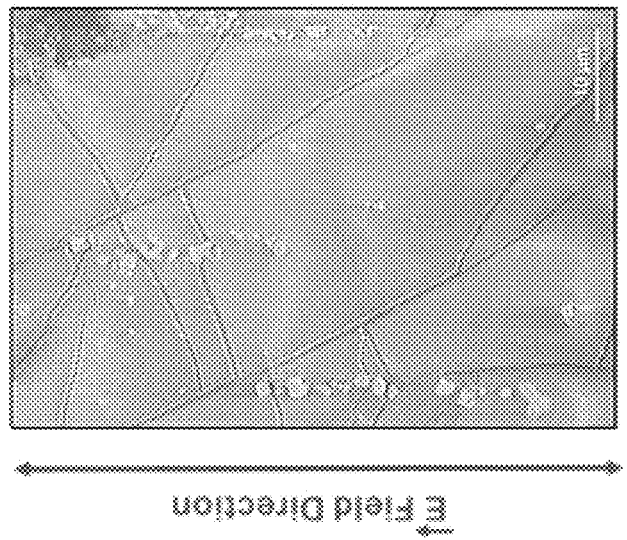
FIGS. 5A and 5B contain scanning electron microscopy (SEM) images showing the effect of the applied electric field on the alignment of PZT particles.
Figure 5A:
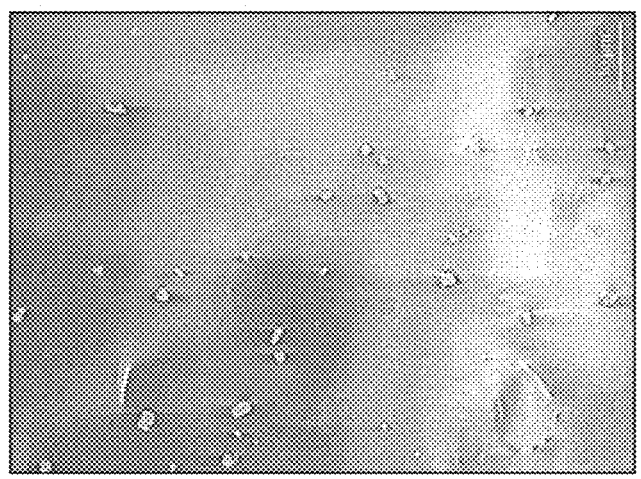

At 2000 seconds (i.e., after the application of the electric field for thirty minutes), the PDMS-based piezoelectric films were cured at a temperature of 85° C. for one hour to freeze the aligned PZT columns. The orientation of the PZT particles was observed under scanning electron microscopy (SEM), as shown in FIGS. 5A and 5B. Image (a) shows randomly distributed PZT particles prior to electric field alignment, and image (b) shows aligned PZT particles following electric field alignment (scale bar=10 µm). The PZT particles are artificially colored to increase the contrast.

Figure 9:
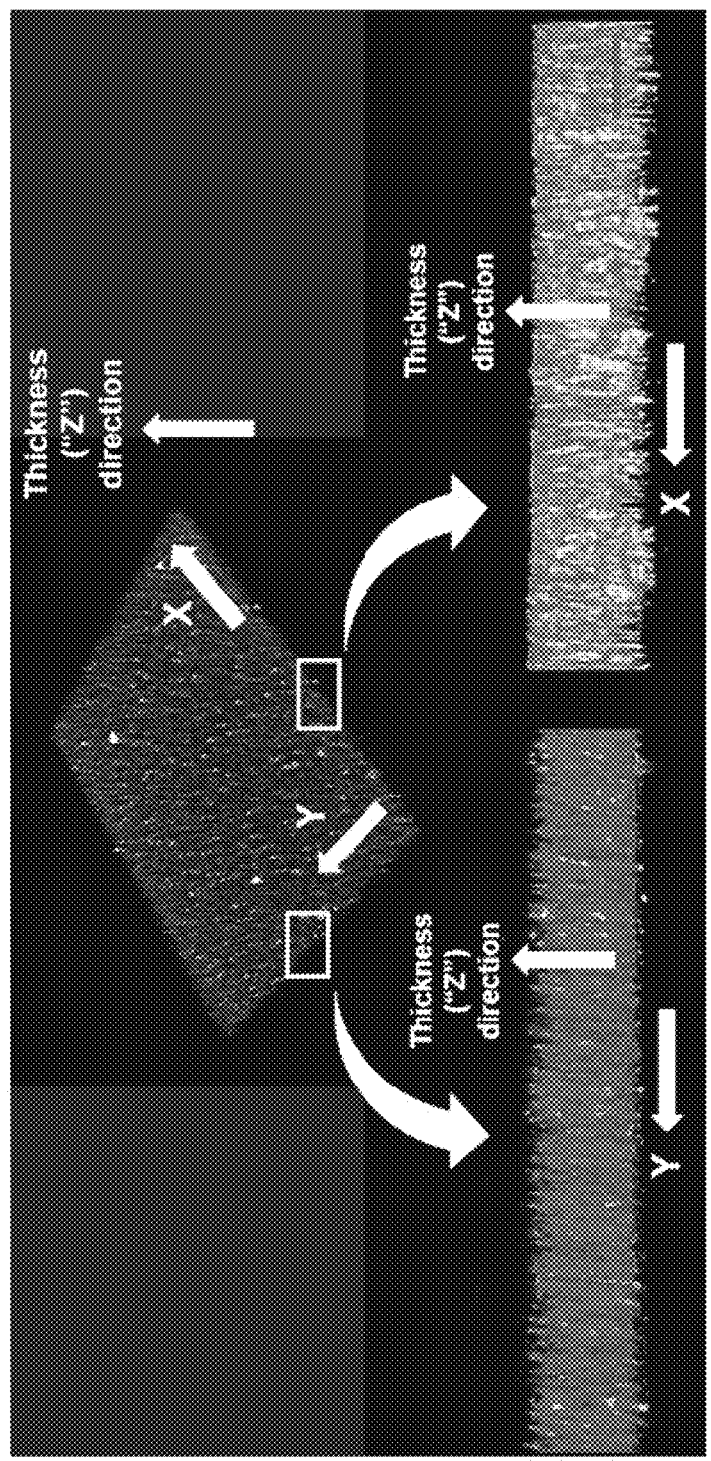
FIG. 9 contains micro-computed tomography (Micro CT) images of aligned PZT particles (scale bar: 100 µm).

To further demonstrate the degree of alignment, micro-computed tomography (Micro CT) images of aligned PZT particles are shown in FIG. 9. The micro-computed tomography images show the preferential alignment of the PZT particles along nanocolumns in the thickness direction of a piezoelectric film.

Figure 7:
FIG. 7 contains an image showing an electric field aligned 150 µm-thick PZT/GNPs/PDMS piezoelectric film.
Figure 11:
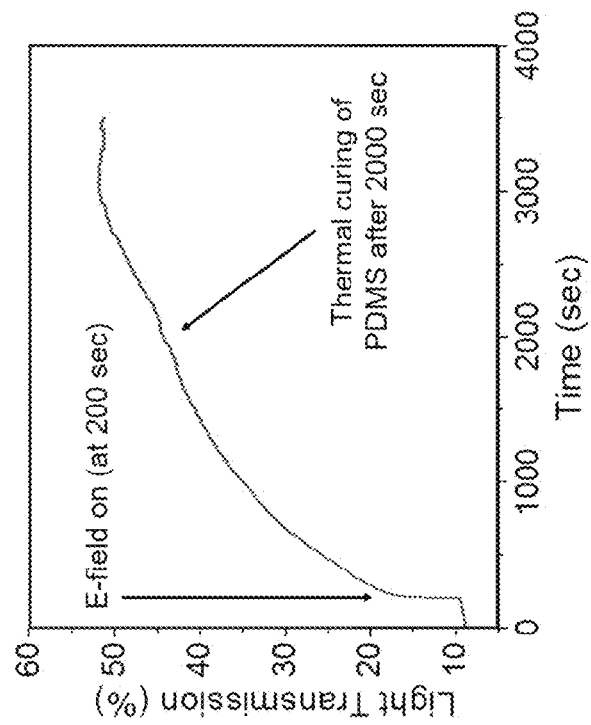
FIGS. 10 and 11 contain real-time light transmission data for two 150 µm-thick piezoelectric films, one a GNPs/PDMS system (0.02 vol. % GNPs) and the other a PZT/GNPs/PDMS system (0.5 vol. % PZT, 0.02 vol. % GNPs).
Figure 10:
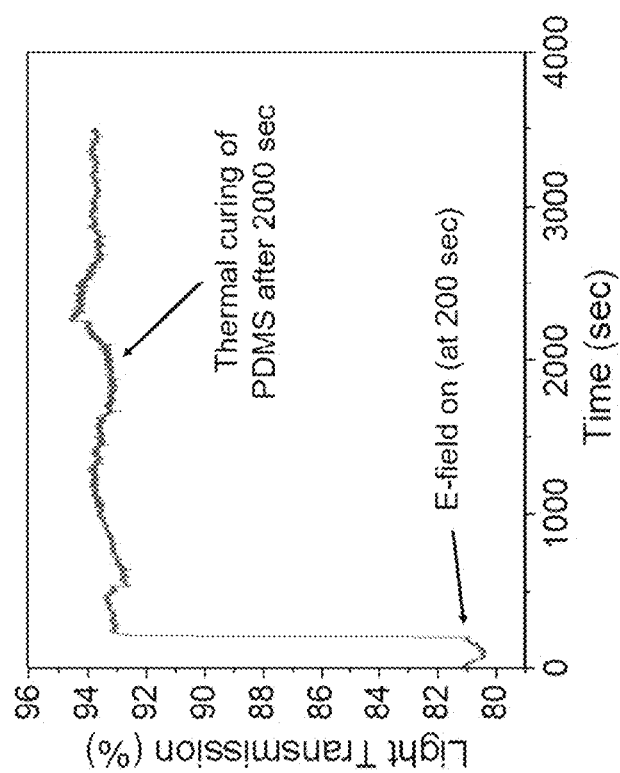

Real-time light transmission data for two 150 µm-thick piezoelectric films, one a GNPs/PDMS system (0.02 vol. % GNPs) and the other a PZT/GNPs/PDMS system (0.5 vol. % PZT, 0.02 vol. % GNPs), are provided in FIGS. 10 and 11, respectively. A uniform electric field was applied for 200 seconds and the samples were thermally cured after 2000 seconds. The light transmission for the GNPs/PDMS sample increased from about 81% to about 94% when subjected to the application of the electric field for 200 seconds, whereas light transmission for the PZT/GNPs/PDMS sample increased from about 8% and saturated around 52% when subjected to the application of the electric field for 200 seconds. FIG. 7 is an image showing the electric field-aligned 150 µm-thick PZT/GNPs/PDMS piezoelectric film (scale bar=1 cm).

Figure 8:
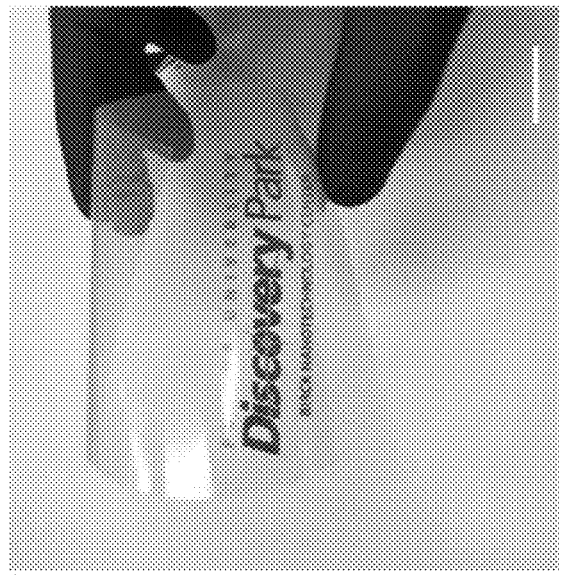
FIG. 8 contains an image showing an electric field-aligned 5 µm-thick PZT/GNPs/PDMS piezoelectric film cast on an ITO coated PET substrate.

FIG. 8 shows an electric field-aligned 5 µm-thick PZT/GNPs/PDMS piezoelectric film that had been cast on an ITO-coated polyethylene terephthalate (PET) substrate (scale bar=2 cm). The piezoelectric film exhibited around 90% optical transparency after electric field alignment.

Figure 6:
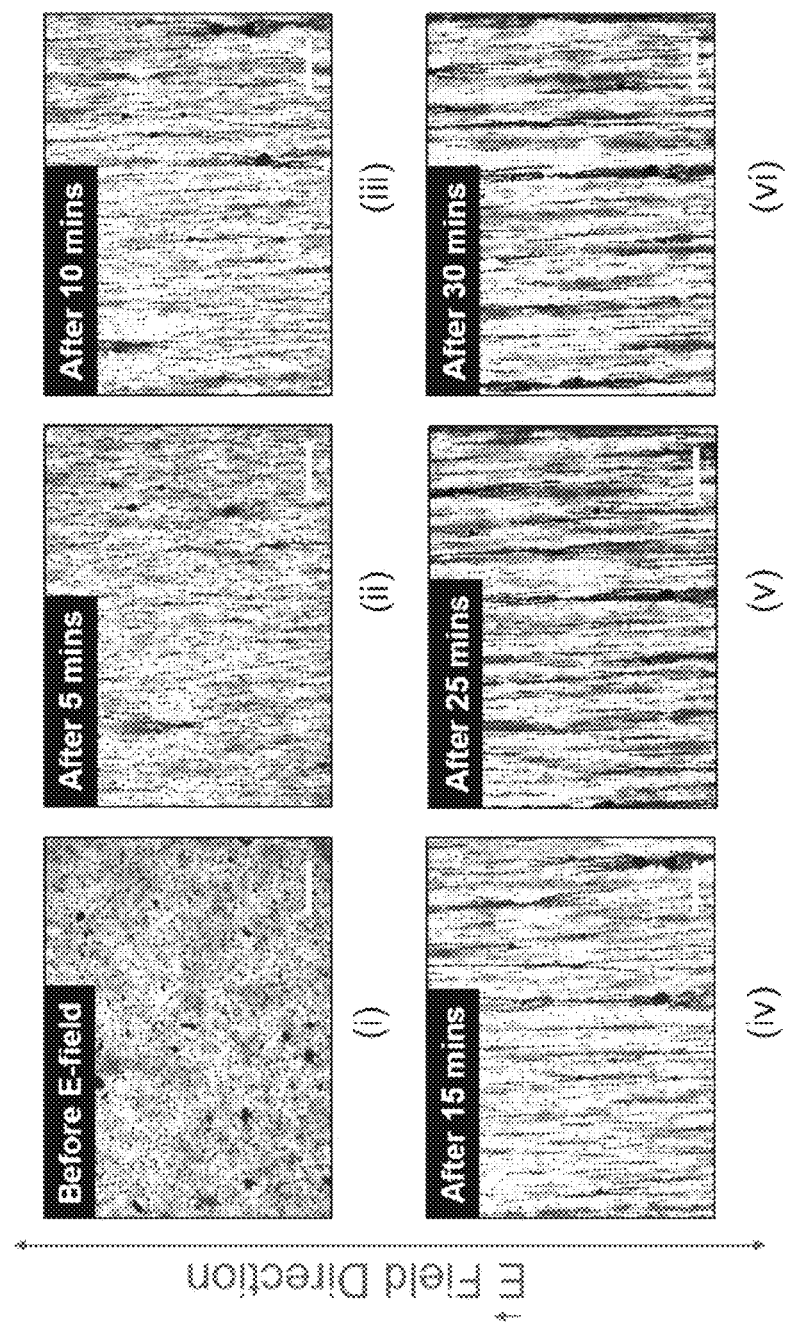
FIG. 6 contains an optical microscope image of a PZT/GNPs/PDMS film and shows the progressive formation of PZT/GNPs columns in the thickness (z) direction of the film during electric field alignment.
Figure 12:
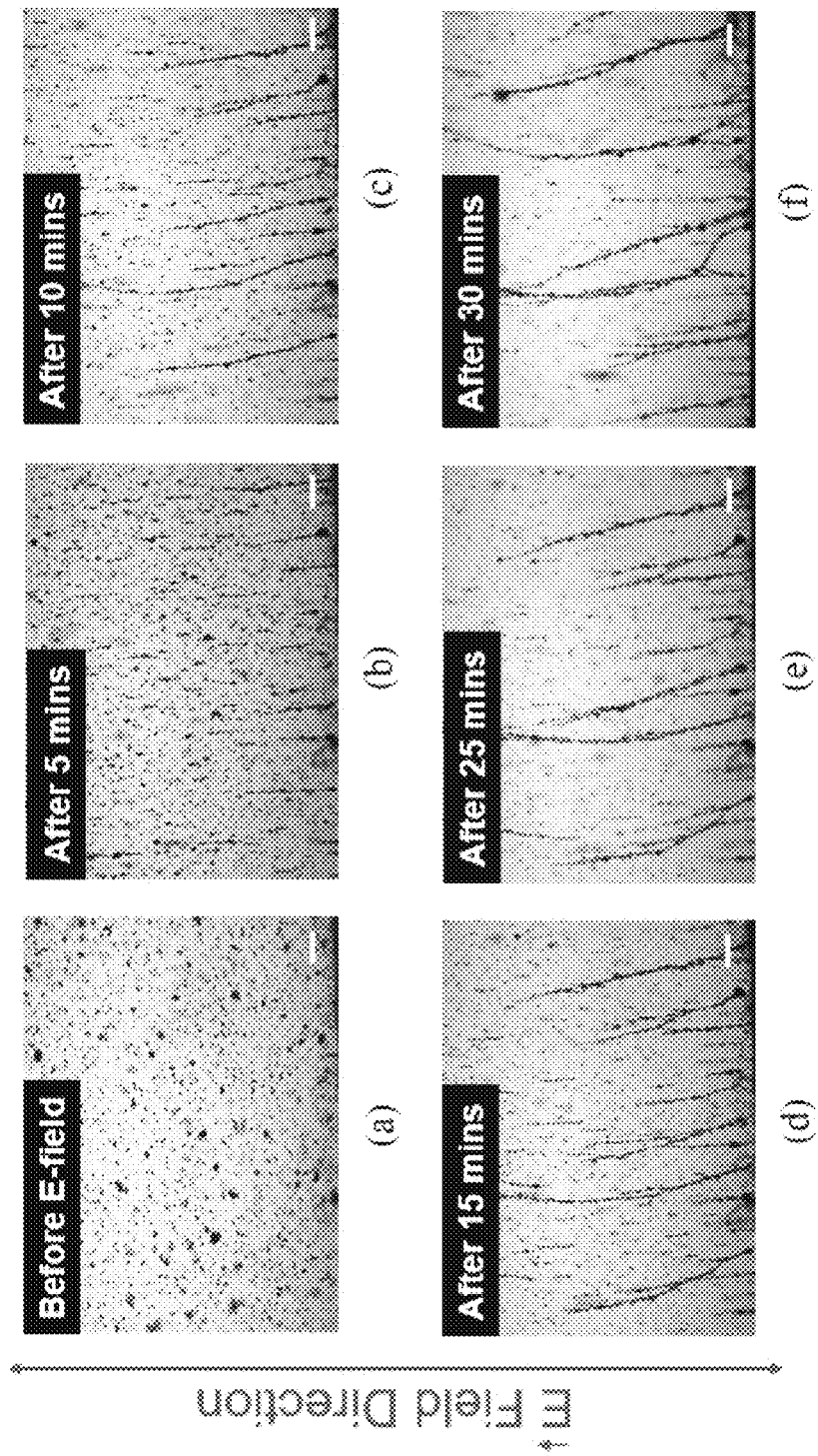
FIG. 12 contains an optical microscope image of a GNPs/PDMS film and shows the progressive formation of GNPs columns in the thickness (z) direction of the film during electric field alignment.

FIGS. 6 and 12 contain optical microscope images that show the real-time alignment of particles in PZT/GNPs/PDMS and GNPs/PDMS films during the application of a uniform electric field, respectively. FIG. 12 shows the formation of GNPs columns in the thickness direction during electric field alignment using an electric field strength of 1000 V/mm (scale bar: 100 µm). Image (a) was taken before the application of the electric field, and images (b), (c), (d), (e), and (f) show alignment progression after 5, 10, 15, 25, and 35 minutes of electric field application. Images (i), (ii), (iii), (iv), (v), and (vi) of FIG. 6 show alignment progression in the PZT/GNPs/PDMS film for the same points in time when subjected to the same electric field strength. As clearly seen, the degree of alignment of particles in both systems increased over time.

Figure 13:
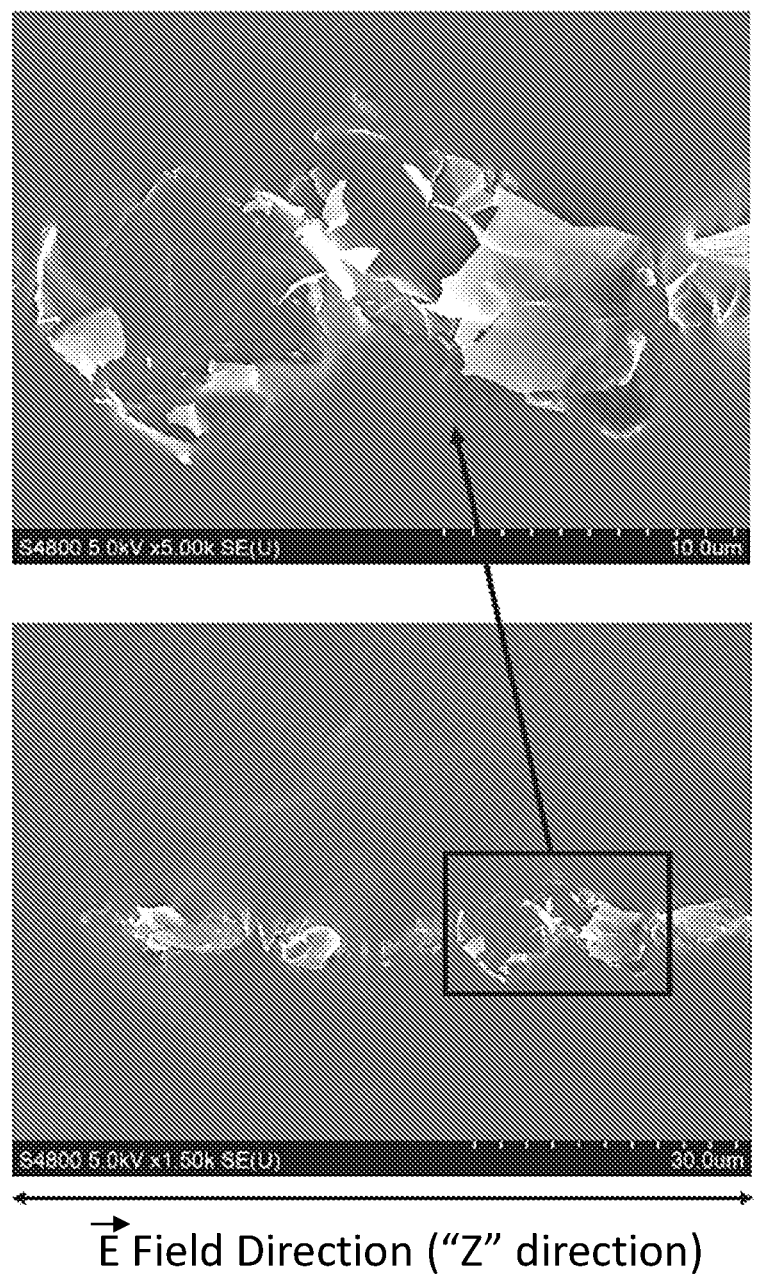
FIGS. 13 and 14 contain cross-sectional SEM images of, respectively, GNPs/PDMS and PZT/GNPs/PDMS films and reveal how the PZT particles and GNPs interacted with each other during electric field-induced alignment.
Figure 14:
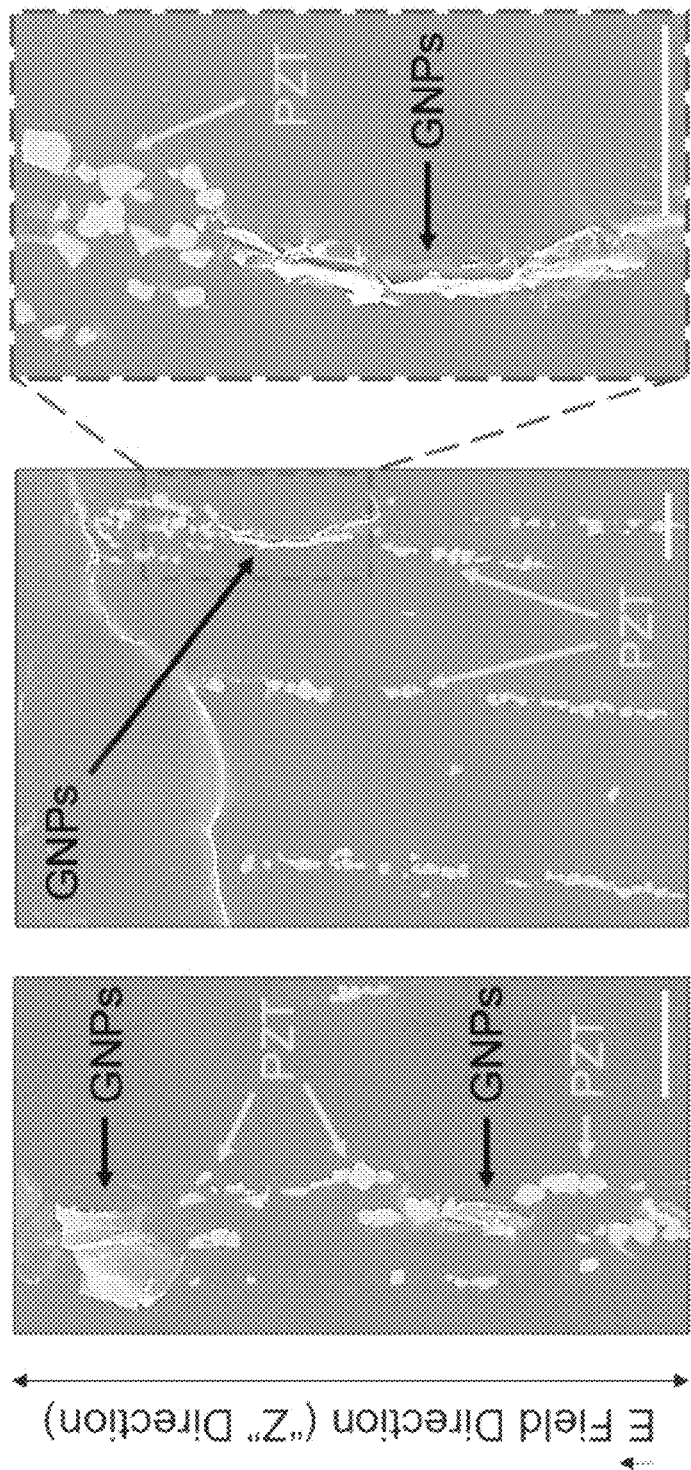
Figure 15:
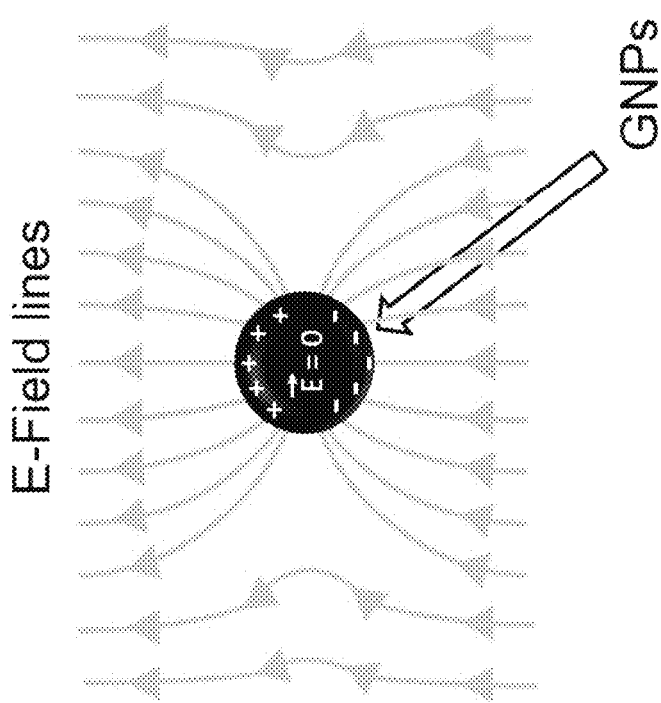
FIG. 15 schematically represents electric field lines around an electrically conducting particle when placed in a uniform external electric field.

FIGS. 13 and 14 contain cross-sectional SEM images of GNPs/PDMS and PZT/GNPs/PDMS films, respectively, and reveal how the PZT particles and GNPs interacted with each other during the electric field-induced alignment. The scale bars in FIG. 14 are 10 µm. As shown in FIG. 14, during alignment the PZT columns formed around the GNPs similar to electric field lines around an electrically conducting particle when placed in a uniform external electric field, schematically represented in FIG. 15. The GNPs are conducting and facilitate the charge transport in the film, hence increasing the sensitivity and nanogenerator capabilities of the piezoelectric films.

Figure 17:
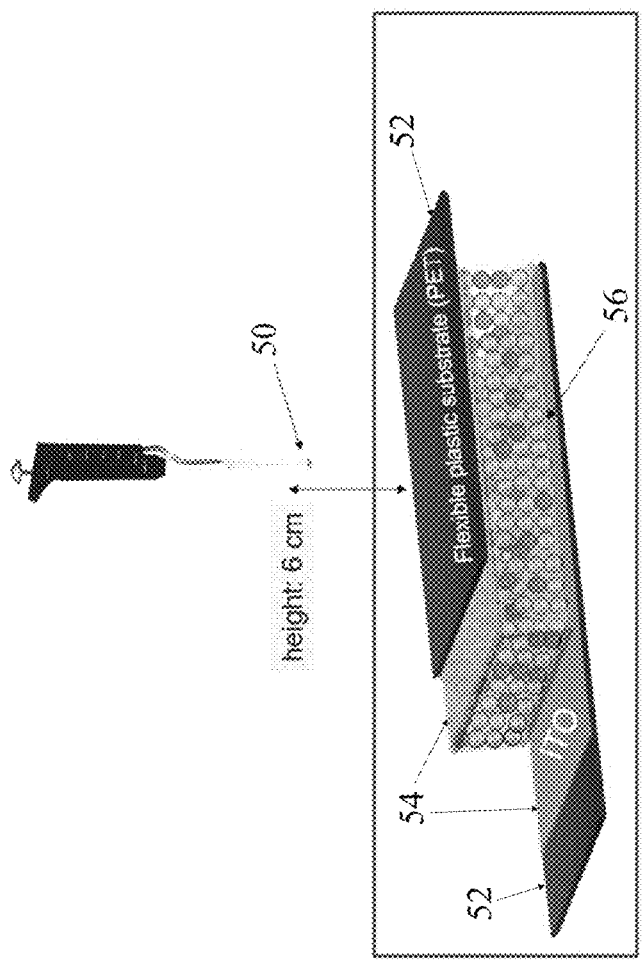
FIG. 17 contains a schematic representation of an experimental set-up of a water drop test.

Further investigations were then conducted to evaluate the piezoelectric responses of PZT/PDMS-based and PZT/GNP/PDMS-based piezoelectric films that had undergone electric field alignment for different periods of time. Devices were produced by laminating cured piezoelectric films between two ITO-coated PET electrodes. For comparison, devices were also fabricated from films that lacked PZT particles and GNPs ("Neat PDMS") but were otherwise identical to the PZT/PDMS-based and PZT/GNP/PDMS-based piezoelectric films. The length, width and thickness dimensions of the devices were 2.5 cm, 1.5 cm, and 150 µm, respectively. Electrical contacts are established with copper tapes and silver paste. The piezoelectric responses of the sample devices were evaluated by measuring the voltage output when different sizes of water droplets (5 µL, 10 µL, 20 µL, 30 µL) were dropped onto the devices from a constant height of 6 cm. The experimental setup is represented in FIG. 17. The schematic includes a water droplet 50, flexible and transparent plastic substrate (PET) 52, transparent ITO coating 54, and aligned PZT particles and GNPs 56.

Figure 19:
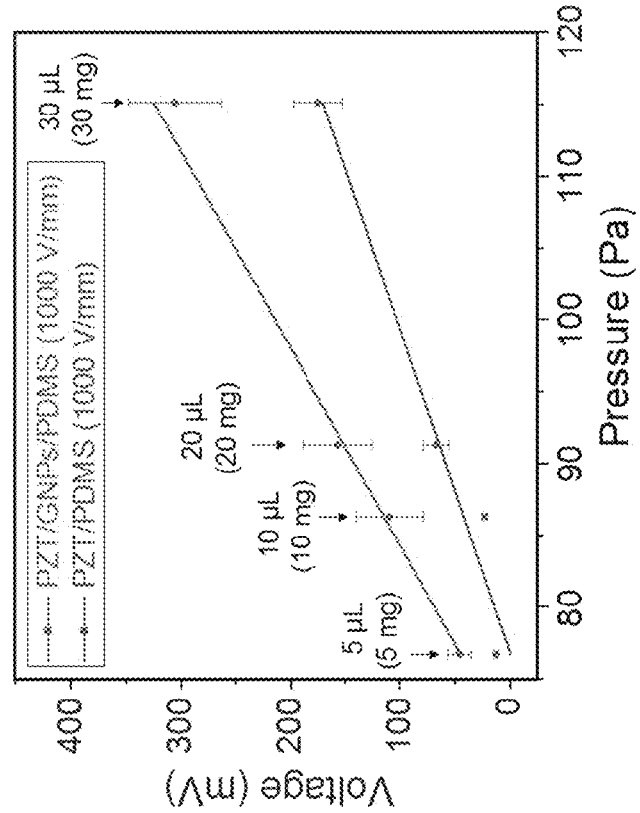
FIG. 19 is a graph evidencing the effect of graphene nanoparticles on voltage generation in a PZT/GNP/PDMS-based device.
Figure 18:
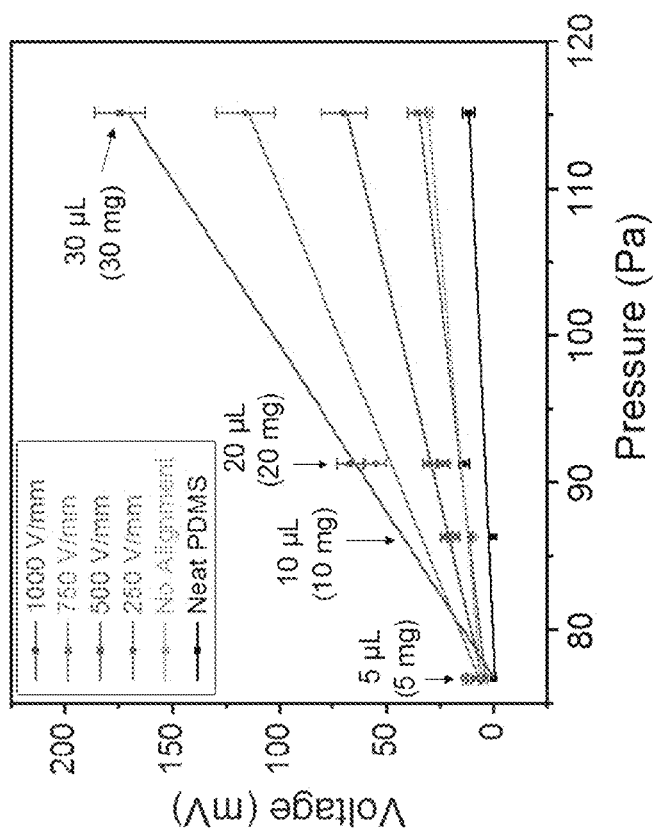
FIG. 18 plots the voltage level generated by PZT/PDMS-based devices relative to the size of droplets impacting the devices.

FIGS. 18 and 19 plot levels of voltage generated for the PZT/PDMS and PZT/GNPs/PDMS-based devices relative to droplet size, respectively. FIGS. 18 and 19 also indicate the calculated impact pressure values of the water droplets on the devices. An oscilloscope was used during the measurements with an input resistance of 10 MΩ. The highest voltage generations were obtained from the device that had been aligned under the highest field strength (1000 V/mm). This result indicated the importance of field strength on the alignment of PZT particles, and hence the piezoelectric response. It can clearly be seen from FIG. 18 that the voltage generation increased with increasing droplet size and approached 175 mV when the 30 µL droplet was delivered.

The voltage outputs that were obtained under the same conditions with the PZT/GNP/PDMS-based devices were dramatically higher. FIG. 19 clearly shows the effect of the graphene nanoparticles on voltage generation. For the 30 µL droplet size, the voltage generation approached 300 mV, compared to 175 mV for the PZT/PDMS-based devices. These results evidenced the outstanding capability of PZT/GNPs/PDMS systems in terms of converting mechanical energy into electrical energy. In comparison, prior investigations reported similar voltage levels as requiring finger pressure of about 2 kPa, much higher than the approximately 115 Pa impact of a water droplet, using piezoelectric nanogenerators based on PZT nanofibers.

Figure 21:
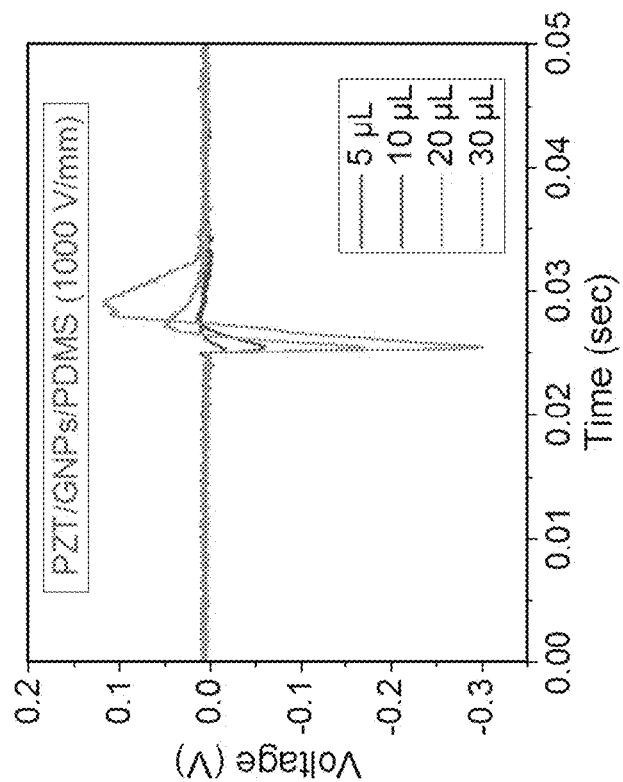
FIGS. 20 and 21 show oscilloscope outputs for different water droplet sizes when delivered onto PZT/PDMS and PZT/GNPs/PDMS-based devices, respectively.
Figure 20:
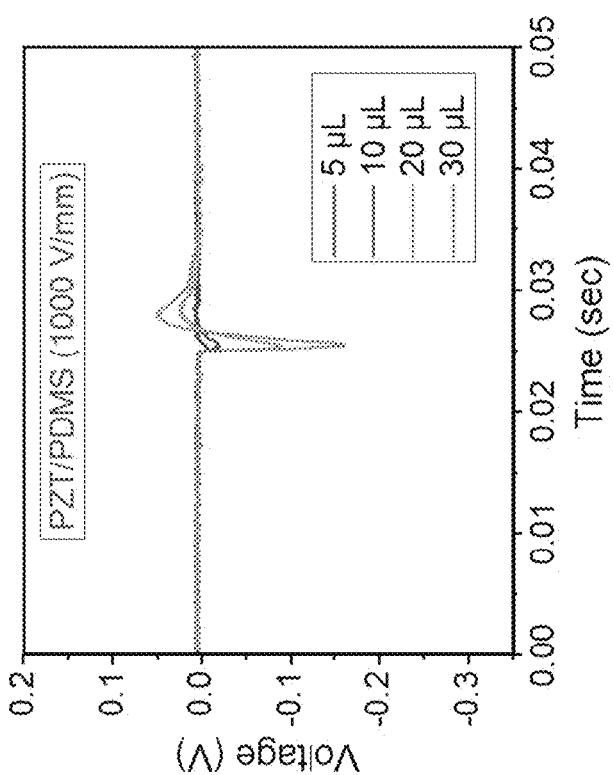
Figure 22:
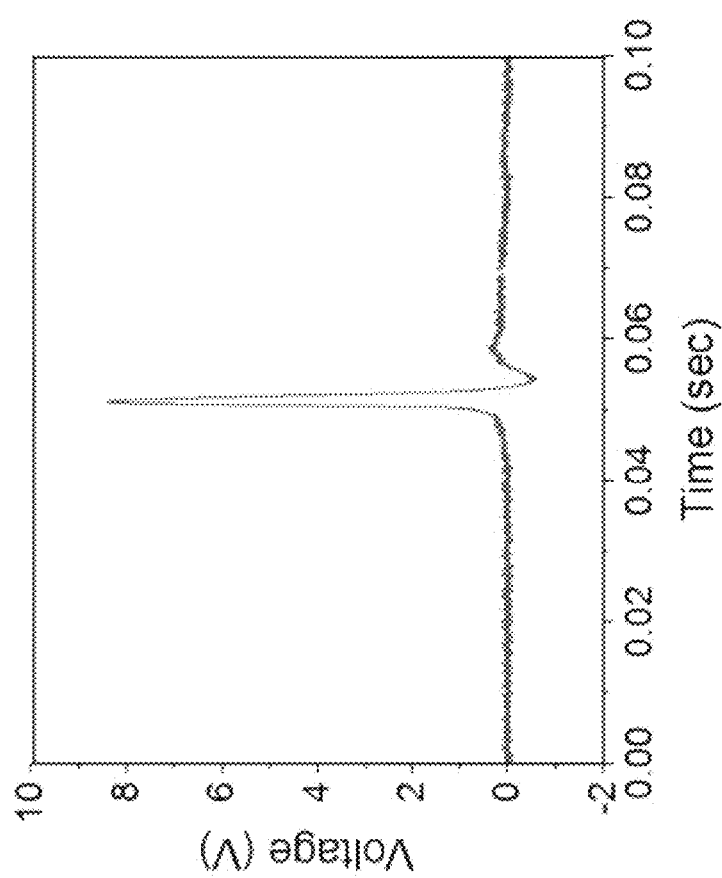
FIG. 22 shows oscilloscope outputs of a PZT/GNPs/PDMS-based device when subjected to the touch of a finger.

To further demonstrate the effect of GNPs, FIGS. 20 and 21 show oscilloscope outputs for different water droplet sizes when delivered onto the PZT/PDMS and PZT/GNPs/PDMS-based devices, respectively, whose data were plotted in FIG. 19. For comparison, FIG. 22 plots the oscilloscope output of the PZT/GNPs/PDMS-based device when subjected to the touch of a finger. The highest voltage output observed for PZT/GNPs/PDMS film was about 8.2 V. In the case of a similar device produced from 5 µm-thick films of FIG. 8, a 5.24 V voltage output was observed during a comparable finger touch experiment.

Besides their energy harvesting capabilities in response to mechanical deformations, the electric field-aligned PZT/GNPs/PDMS samples were also capable of sensing very small pressures. To demonstrate the outstanding pressure sensing features of the PZT/GNPs/PDMS devices, a bird feather (6.8 mg) was used as a load on a sample of a PZT/GNPs/PDMS-based device. When the bird feather was dropped onto the surface, an approximately 20 mV peak-to-peak voltage output was observed over a 20-millisecond range. The PZT/GNPs/PDMS-based devices were demonstrated as capable of sensing much smaller loads (a piece of a bird feather with a weight of 1.4 mg) at very fast response times.

Figure 23:
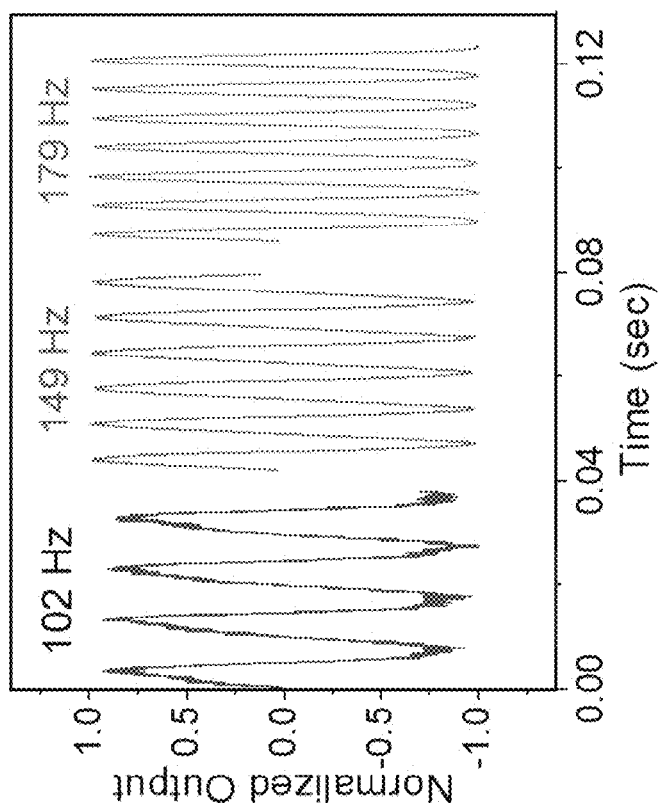
FIG. 23 contains a graph showing normalized outputs at different mechanical vibration frequencies (film dimension: 2.5 cm×1.5 cm×150 µm).

To demonstrate that the PZT/GNPs/PDMS samples were capable of detecting vibrations, a small vibration motor was attached on a plastic cantilever and connected to a power supply to deliver loads to the samples at different frequencies. The normalized output is shown in FIG. 23. The voltage output was normalized to remove amplitude variations caused by the frequency dependence of both the mechanical impedance of the cantilever and vibratory motor output (normal for all mechanical transducers and couplers).

This experiment showed that the films were able to reproduce vibratory inputs at different frequencies as low as 102 Hz.

Figure 24:
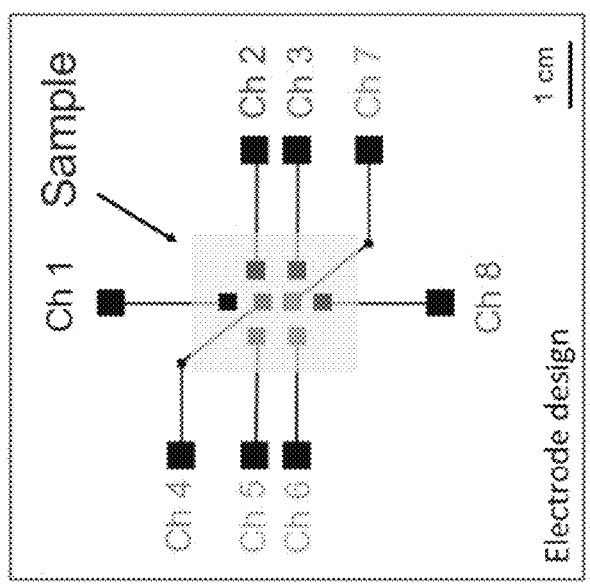
FIG. 24 contains a schematic representation of inkjet-printed silver electrodes located on the film.
Figure 25:
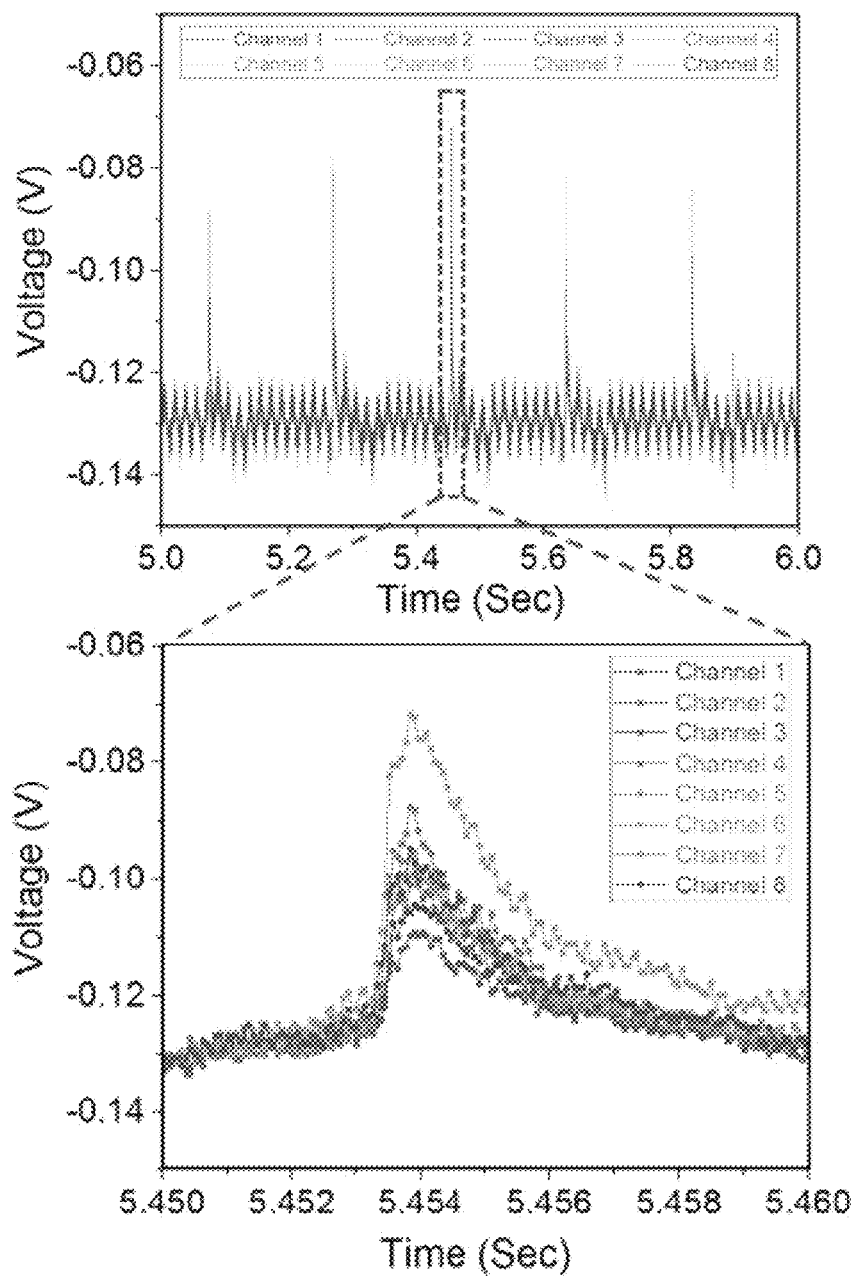
FIG. 25 contains graphs representing an output voltage versus time plot. The magnified view shows the variations in voltage generation (due to non-uniform pressure distribution) obtained from each individual electrode.
Figure 26:
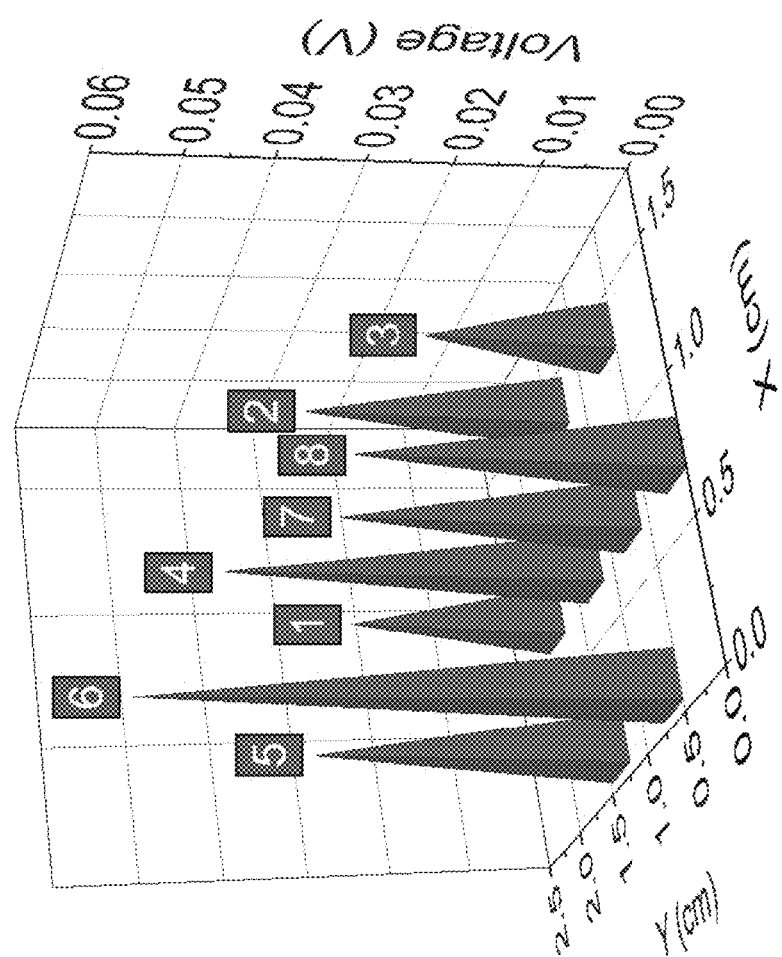
FIG. 26 contains a three-dimensional plot representing exact locations of each electrode along with the corresponding generated output voltage.

To demonstrate the pressure mapping capability of this anisotropic piezoelectric film, silver ink electrodes (0.25 cm×0.25 cm) were applied at eight different positions on a transparent PET substrate. The top electrode was ITO-coated PET, with a total thickness of 175 μm. The aligned PZT/GNPs/PDMS film was sandwiched between the top and bottom electrodes. This experimental set-up is shown in a schematic representation in FIG. 24. For calibration, a 20 g weight was dropped on each electrode pad one at a time from a certain distance to determine the response levels. A finger tap on the sample illustrated the effectiveness of the mapping process. Different voltage values were recorded for each electrode representing pressure variations caused by the nonuniform forces exerted by the fingertip due to its geometry (FIG. 25). Most of the pressure was delivered on electrode 6 since it had shown the highest signal, while the electrodes next to it (e.g., 7 and 8) exhibited relatively low signals. The electrodes far from electrode 6, such as electrodes 1 and 3, had the lowest pulse values (FIG. 26).

The promising high-tech future of the "Internet of Things" (IoT) and flexible electronics cannot be fully achieved without the availability of self-powered electronics and sensors. For this purpose, a great deal of research has been focused on the development of nano and macro-sized energy harvesters and sensors. To date suggested methods for production of highly efficient nanogenerators and sensors have been limited in terms of flexibility, transparency, sensitivity, and performance of the devices. As reported herein, high-performance PZT/GNP/PDMS devices were produced that were flexible and transparent, and shown to be well suited for use in piezoelectric nanogenerators and pressure sensors. With the electric field alignment method described above, the quantity of particles required to develop a piezoelectric effect was greatly reduced. As a result, transparency can be maintained for certain applications, for example, touchscreen interfaces, display panels, and electronic skin for soft robotics. The electric field-induced alignment of PZT particles along with conductive graphitic nanoparticles (graphene nanoplatelets) were shown to facilitate charge transport. As revealed by the SEM images, this preferential alignment in thickness direction gave rise to a unique structure where the pattern of the PZT chains around the GNPs are similar to those electric field lines around an electrically conducting particle when placed in a uniform external electric field.

Figure 27:
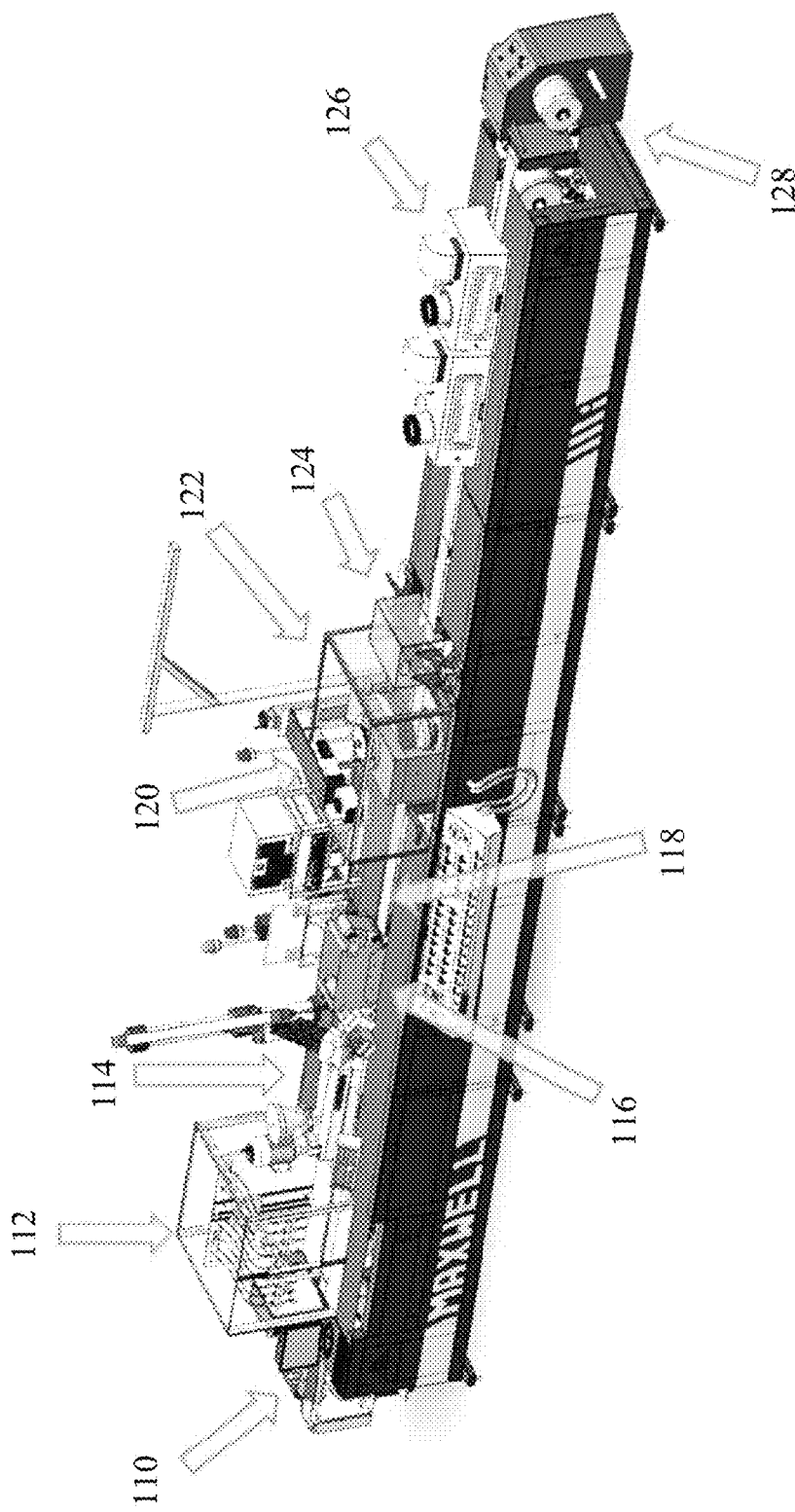
FIG. 27 contains a schematic representation of a nonlimiting example of a roll-to-roll continuous multi-functional film manufacturing line capable of producing PZT/GNPs/PDMS-based piezoelectric nanogenerators.

PZT/GNPs/PDMS-based piezoelectric nanogenerators and other piezoelectric polymer composite films configured as described above can be fully compatible with a continuous large-scale roll-to-roll (R2R) production line that is capable of increasing the size and number of devices that can be produced in a given time period while reducing material costs as compared to traditional batch methods. A nonlimiting example of a particular roll-to-roll continuous machine capable of producing piezoelectric polymer composite films is disclosed in International Publication WO2018/081357, whose contents are incorporated herein by reference. FIG. 27 schematically represents a nonlimiting example of a roll-to-roll multi-functional film manufacturing line disclosed in International Publication WO2018/081357, and depicts the manufacturing line as comprising various processing zones including but not limited to: an unwinding and solution casting zone 110, an electrospinning zone 112, a melt casting zone 114, an electric field (E-field) alignment zone 116, heating plates 118, a laser heating zone 120, a magnetic field alignment zone 122, an ultraviolet (UV) curing zone 124, a heating oven zone 126, and a rewind station zone 128.

During production of films with the machine of FIG. 27, a solution was initially cast via a doctor blade on a flexible and transparent substrate (e.g., PET) in the unwinding and solution casting zone where a high precision granite plate was used to level a casting blade. By using the information obtained from FIG. 6 and FIG. 11, the line speed was precisely calculated and adjusted (e.g., 20 mm/min) to allow sufficient time for PZT and graphene particles to align under the electric field zone. The electric field zone included two electrodes; a conductive top electrode (e.g., copper or a transparent ITO-coated PET) and a grounded bottom electrode. The top electrode was connected to a high voltage (HV) amplifier combined with a wavefunction generator and an oscilloscope to generate and monitor the sinusoidal AC waveform and the amplitude of the electric field. Preferably, a 1 mm air gap was provided between the two electrodes by adjusting the digital height controller located on the HV amplifier.

Individual heating plates were utilized to control the curing process during the electric field alignment, three under the substrate and three on the top copper electrode. Four of the heating plates (two under the substrate and two on the top copper electrode) were maintained at room temperature to avoid any pre-curing of the sample and promote the effectiveness of electric field on formation of nanocolumns, whereas the temperatures of the remaining two heating plates (one under the substrate and one on the top copper electrode) were set to 85° C. to cure and then lock in the aligned column structures before they exit the electric field section. The electric field strength between the two electrodes was set to 1000 V/mm. SEM images (FIG. 16) were taken to verify the alignment.

Disclosed above are approaches to producing high performance, flexible and transparent PZT/Graphene nanoplatelets (GNPs)/PDMS (polydimethylsiloxane) based piezoelectric nanogenerators and a highly sensitive pressure sensor where PZT particles and GNPs were aligned under an AC electric field in the thickness direction. With the electric field alignment method described, the amount of particles required to develop a piezoelectric polymer composite was greatly reduced relative to conventional methods. As a result, transparency was maintained for desired applications such as touch screen interfaces. Moreover, this approach provides for alignment of PZT particles along with conductive graphitic nanoparticles (i.e. graphene nanoplatelets) to facilitate the charge transport in the system. As revealed by SEM images, this preferential alignment in the thickness direction gives rise to patterns of the PZT chains around the GNPs that are similar to the electric field lines around an electrically conducting particle placed in a uniform external electric field.

According to another embodiment of the present disclosure, a layered sensor/actuator is provided that can i) sense time-varying forces, ii) static forces, and iii) generate power from vibrational movements. Referring to FIG. 28 a schematic of a perspective view of the sensor/actuator 200 is shown. The sensor/actuator 200 includes an electrode layer 202, a piezoelectric layer 204, an electrode layer 206, a piezoresistive layer 208, a thin film transistor (TFT) layer 212, and another electrode layer 214. Some of the electrode layers 202, 206, 210, and 214 can be combined to provide one or more less layers by integrating the electrode layers with active layers (i.e., the piezoelectric layer 204, the piezoresistive layer 208, and the TFT layer 212), as known by a person having ordinary skill in the art.

The piezoelectric 204 is composed of vertically aligned (via electric field assisted alignment) Lead Zirconate Titanate (PZT) particles and Graphene Nanoplatelets (GNPs) in a polymer matrix, discussed in detail above.

The piezoresistive layer 208 is made of a piezoresistive material which includes a class of materials that exhibits a change in electrical resistance in response to mechanical force or pressure applied to the material. In particular, the change in resistance is due to time-invariant forces (i.e., static forces). Signals with voltages representing the chance in resistance which correspond to the magnitude of the applied force is thereby generated by the piezoresistive layer 208 based on the change in resistance. This signal representing change in resistance is conveyed to terminals (not shown) of the sensor/actuator 200 via one or more of the electrode layers 202, 206, 210, or 214. The signal can then be captured by a processor and passed through an analog to digital converter to convert to a digital signal for further processing.

According to one embodiment of the present disclosure, the piezoresistive layer 208 composed of nickel particles aligned through magnetic field assisted alignment of in the thickness (vertical or "Z") direction. Alternatively, according to another embodiment, the piezoresistive layer 208 comprises poly(3,4-ethylenedioxythiophene) polystyrene sulfonate which is a polymer mixture of two ionomers. One constituent of this mixture comprises sodium polystyrene sulfonate which is a sulfonated polystyrene, as known to a person having ordinary skill in the art. The other constituent poly(3,4-ethylenedioxythiophene) is a conjugated polymer and carries positive charges and is based on polythiophene. The combination is known as PEDOT:PSS which s the advantage of also being transparent light.

The TFT layer 214 may include a plurality of bipolar transistors, thin film field effect transistors, capacitors, a network of diodes, and a series of metal traces for data, gate, supply and ground lines, and other circuit components discussed herein and known by a person having ordinary skill in the art. These circuit components are provided on the TFT layer 214 in a manner conducive to make the entirety of the TFT layer 214 flexible.

The electrode layers 202, 206, 210, and 214 are layers of metal similar to a semiconductor construction made up of various metals, e.g., gold, silver, copper, aluminum, or other metals known to a person having ordinary skill in the art. The layers allow signals from the piezoresistive layer 208, the piezoelectric layer 204, and the TFT layer 212 to communicate internally within the sensor/actuator 200 and externally from terminals (not shown).

All the layers discussed herein with respect to the sensor/actuator 200 are intended to allow flexibility for the sensor/actuator 200. The flexibility of the sensor/actuator 200 shall range from 0° to 180°.

Figure 29C:
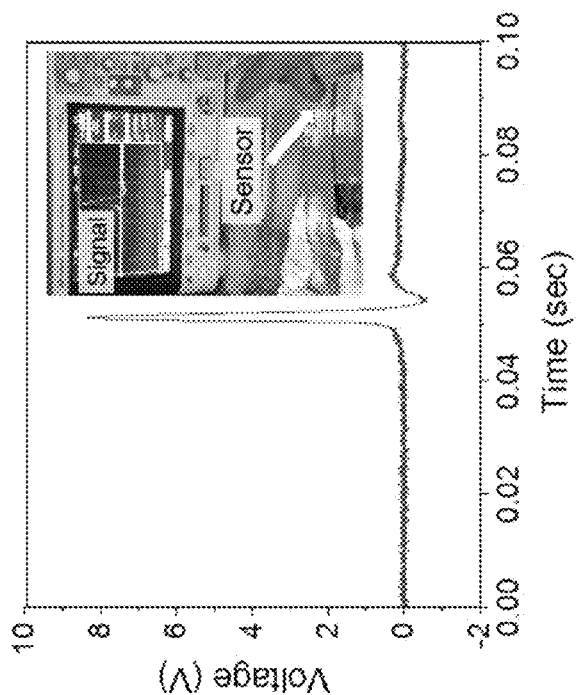
FIG. 29c is a graph of voltage vs. time showing the sensitivity of the piezoelectric layer in response to a quick touch of a finger on the sensor.
Figure 29B:
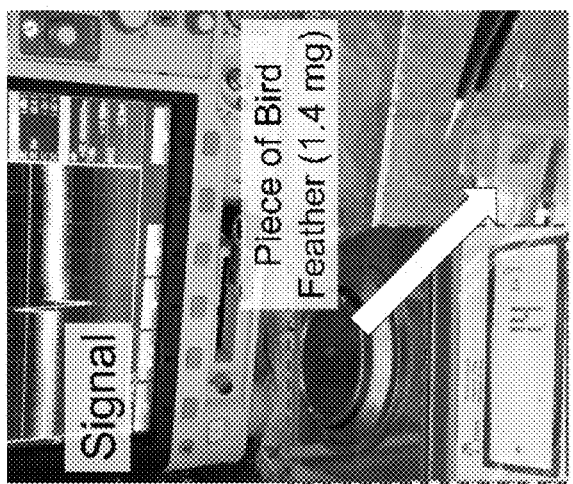
FIGS. 29a and 29b are photographs of an experimental setup to measure dynamic forces according to the sensor shown in FIG. 28, where a 2.5 cm×1.5 cm sample of the sensor was used to measure a bird feather having a weight of 6.8 mg that was dropped on the sensor (29a), and where a piece of the feather weighting 1.4 mg is dropped on the sensor (29b).
Figure 29A:
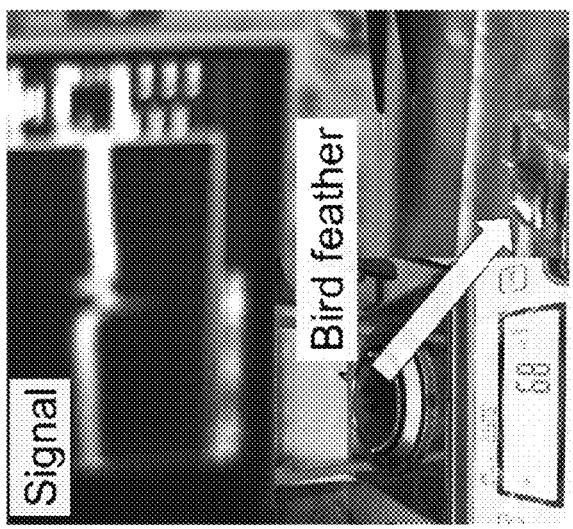
Figure 30B:
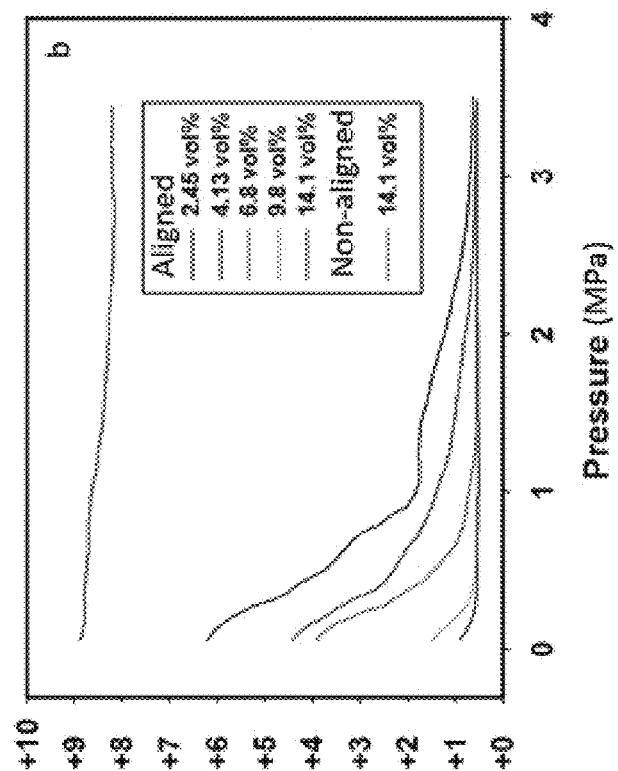
FIGS. 30a and 30b are graphs of resistivity vs. pressure showing resistivity change during compression for nickel powder/PDMS (FIG. 30a) and nickel flake/PDMS (FIG. 30b), according to different embodiments of the present disclosure.
Figure 30A:
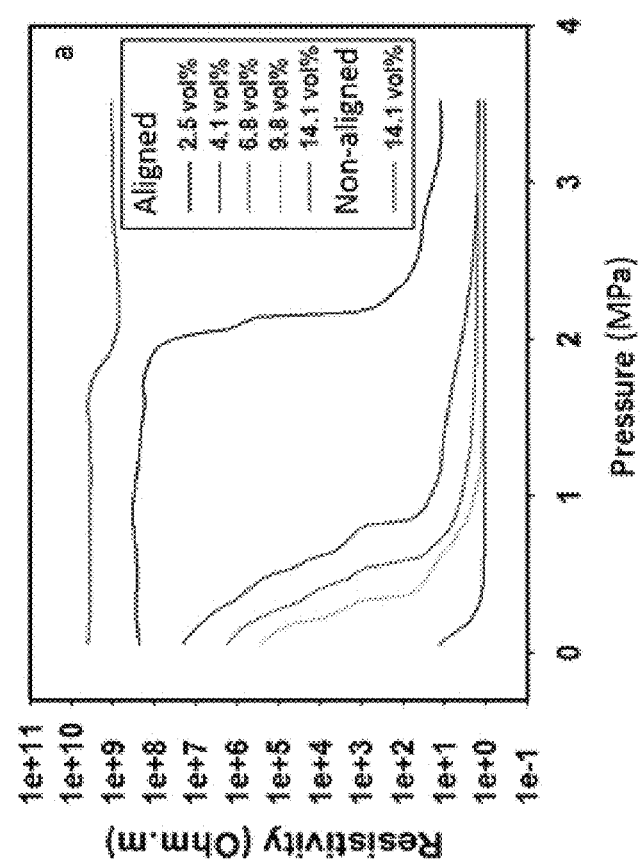

The various layers discussed in the sensor/actuator 200 serve different purposes. For example, the piezoelectric layer 204 is configured to convert mechanical time-varying forces into electrical signals, while be inactive when static forces are applied. Conversely, the piezoresistive layer 208 is configured to convert static mechanical forces into electrical signal while inactive when time varying forces are applied. To this end, the sensor/actuator 200 was actually reduced to practice and tested with a bird feather. Referring to FIGS. 29a, and 29b, a setup is shown to measure dynamic forces. A 2.5 cm×1.5 cm sample of the sensor/actuator 200 was prepared for demonstration purposes. In FIG. 29a, a bird feather having a weight of 6.8 mg was dropped on the sensor/actuator 200. A signal as shown in the oscilloscope in the background clearly shows registration of the dynamic force of the feather landing on the sensor/actuator 200. In FIG. 29b, a piece of the feather weighting merely 1.4 mg is dropped on the sensor/actuator 200. Again the signal on the oscilloscope clearly captures the sensitivity of piezoelectric layer 204 of the sensor/actuator 200. In FIG. 29c, again the sensitivity of the piezoelectric layer 204 is shown. The signal in the graph of voltage in V vs. time in seconds which shows responsiveness of the piezoelectric layer 204 in response to a quick touch of a finger on the sensor/actuator 200. The graph shows response to a pressure by finger to the sensor/actuator 200 resulting in a transient signal with 8.2 V amplitude. This signal is caused because of a time-varying force (i.e., the finger initially coming into contact, then applying a force, and then leaving the sensor/actuator 200). Referring to FIGS. 30a and 30b, resistivity change during compression for nickel powder/PDMS (FIG. 30a) and nickel flake/PDMS (FIG. 30b) are shown. In each figure, graphs of resistivity in Ohm-cm vs. pressure in MPa are shown. In cases of processing where nickel particles are aligned using magnetic field assisted alignment, in both FIGS. 30a and 30b, the change in resistivity is precipitous upon application of static force.

Figures 31A, 31B:
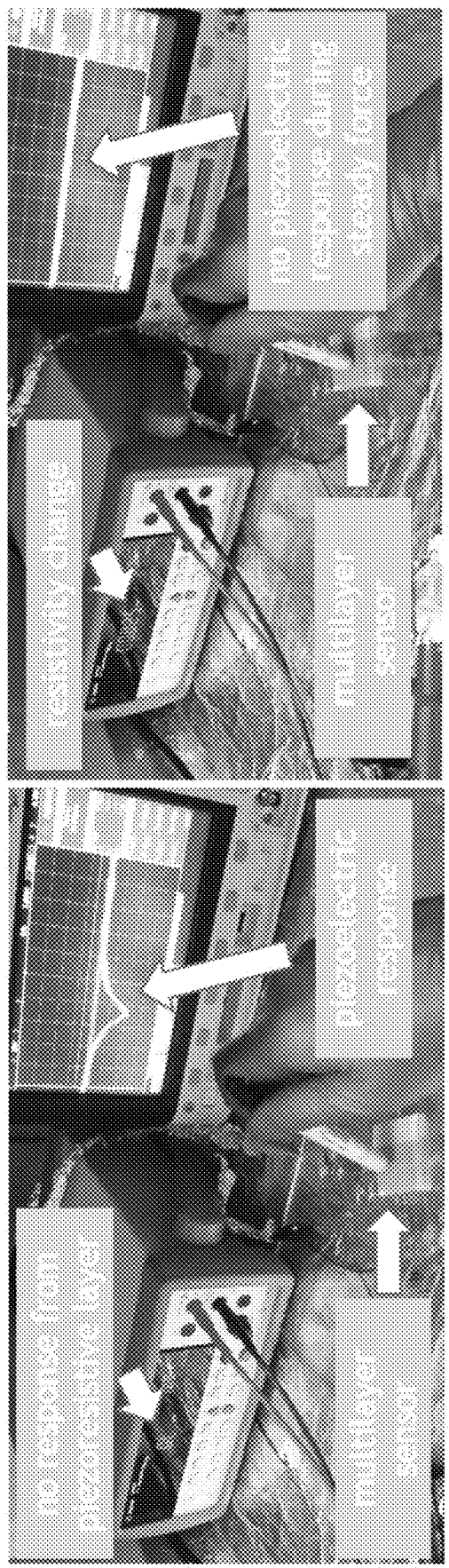
FIGS. 31a and 31b are photographs of the experimental setup for testing sensitivity to static and dynamic forces.

To demonstrate discrimination between static and dynamic forces and responsiveness of the piezoelectric layer 204 vs. the piezoresistive layer 208 in the same sensor/actuator 200 construction, a static three was applied to the sensor/actuator 200 as shown in FIGS. 31a and 31b which are photographs of the setup for testing sensitivity to static and dynamic forces. As seen in FIG. 31a, the piezoelectric layer 204 responds to a sudden change in an applied force while the piezoresistive layer 208 shows no change in resistance and thus no discernable signal. Conversely, when the force is applied in a static manner, the piezoelectric layer 204 provides no discernable signal, while the piezoresistive layer 208 shows a marked change in its resistance that can be measured externally or by the TFT layer 214. In particular, the first touch on the sensor/actuator 200 was sensed by the piezoelectric layer 204 and appeared as an electrical signal (millisecond range representing a fast response time) shown on the oscilloscope screen in the background. However, in the case of a constant pressure, the piezoresistive layer 208 then becomes active and the resistivity of the system varies from greater than about 100MΩ to about 0.01Ω, indicating an increasing pressure levels on the hybrid structure. In the present disclosure, the term "about" can allow for a degree of variability in a value or range, for example, within 10%, within 5%, or within 1% of a stated value or of a stated limit of a range.

Figure 32:
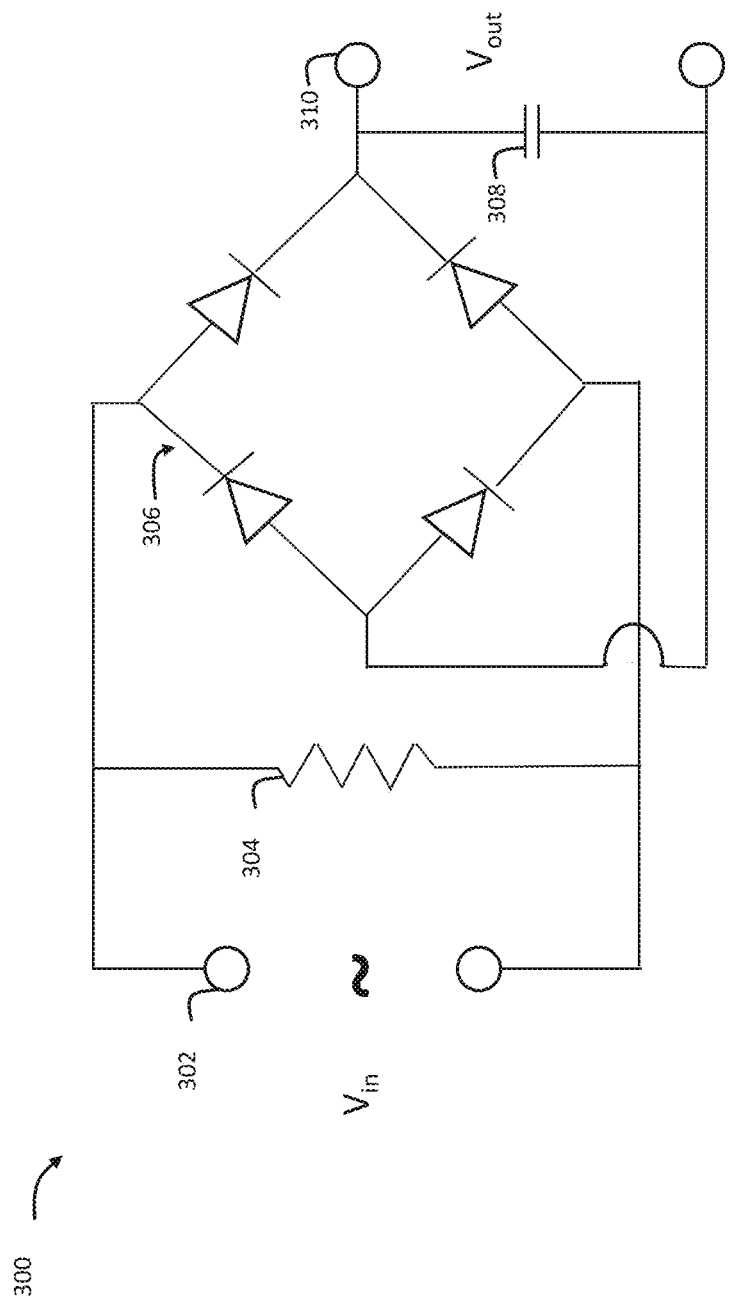
FIG. 32 is a schematic of an energy harvesting system is shown, according to one embodiment of the present disclosure.

While the sensor/actuator 200 has been discussed from the standpoint of a sensor, it can also be used as an energy harvester. Harvesting energy from piezoelectric devices are known in the art. Referring to FIG. 32, an exemplary schematic of an energy harvesting system is shown, however, many other circuits known to a person having ordinary skill in the art are also possible. The energy harvesting circuit 300 includes input terminals 302 which are coupled to the piezoelectric layer 204. The terminals 302 are then routed to a diode network 306 with a resistor 304 in parallel therewith. The output of the diode network is coupled to terminals 310 with a capacitor 308 parallel therewith. The capacitor 308 charges every time the piezoelectric layer 204 experiences a dynamic force, e.g., vibration. As the voltage is applied to the capacitor 308, the diode network 306 rectifies the alternating signal thereby allowing voltage to rise in the capacitor 308.

While the invention has been described in terms of specific or particular embodiments and investigations, it should be apparent that alternatives could be adopted by one skilled in the art. For example, piezoelectric composite devices could differ in appearance and construction from the embodiments described herein, various amounts of PZT and electrically conductive nanoparticles could be combined in a variety of polymer matrix materials, process parameters such as temperatures and durations could be modified, and appropriate materials could be substituted for those noted. In addition, the invention encompasses additional or alternative embodiments in which one or more features or aspects of different disclosed embodiments may be omitted or combined. Accordingly, it should be understood that the invention is not necessarily limited to any embodiment described herein or illustrated in the drawings. It should also be understood that the phraseology and terminology employed above are for the purpose of describing the disclosed and illustrated embodiments and investigations, and do not necessarily serve as limitations to the scope of the invention. Therefore, the scope of the invention is to be limited only by the following claims.

The invention claimed is:

1. A sensor, comprising:
a piezoelectric layer;
a piezoresistive layer;
one or more electrode layers coupled to the piezoelectric layer and to the piezoresistive layer;
the piezoelectric layer configured to provide an electrical signal in response to application of a dynamic disturbance; and
the piezoresistive layer configured to provide a change in resistivity in response to application of a static disturbance,
wherein the piezoresistive layer comprises nickel particles aligned by a magnetic field in PDMS.

2. The sensor of claim 1, wherein the resistivity of the piezoresistive layer change by more than about 105 ohm-cm when a static disturbance of between about 1 to about 3 MPa is applied.

3. The sensor of claim 1, further comprising a thin film transistor (TFT) layer disposed in the sensor.

4. The sensor of claim 1, wherein the TFT layer is coupled to the piezoelectric layer.

5. The sensor of claim 4, the TFT layer includes an energy harvesting circuit configured to convert dynamic disturbance applied to the piezoelectric layer into charge held in a capacitor.

6. The sensor of claim 5, the energy harvesting circuit includes a diode network disposed in a bridge configuration configured to rectify time varying signal from the piezoelectric layer into a rectified current.

7. The sensor of claim 1, wherein the nickel particles are in form of powder.

8. The sensor of claim 1, wherein the nickel particles are in form of flakes.

9. The sensor of claim 1, the piezoelectric layer comprises vertically aligned lead zirconate titanate (PZT) particles and Graphene Nanoplatelets (GNPs) in a polymer matrix.

10. The sensor of claim 1, the PZT is aligned via electric field assisted alignment.

* * * * *